(12) United States Patent
Dedic et al.

(10) Patent No.: US 7,034,733 B2
(45) Date of Patent: Apr. 25, 2006

(54) SWITCHING CIRCUITRY

(75) Inventors: Ian Juso Dedic, Northolt (GB); Darren Walker, Twyford (GB)

(73) Assignee: Fujitsu Limited, Kawasaki (JP)

( * ) Notice: Subject to any disclaimer, the term of this patent is extended or adjusted under 35 U.S.C. 154(b) by 82 days.

(21) Appl. No.: 10/158,918

(22) Filed: Jun. 3, 2002

(65) Prior Publication Data
US 2003/0043062 A1 Mar. 6, 2003

(30) Foreign Application Priority Data
Aug. 24, 2001 (GB) .............................. 0120714

(51) Int. Cl.
H03M 1/66 (2006.01)

(52) U.S. Cl. ........................................ 341/150; 341/144
(58) Field of Classification Search ................ 341/144, 341/155, 122, 110, 150
See application file for complete search history.

(56) References Cited

U.S. PATENT DOCUMENTS

| | | | |
|---|---|---|---|
| 4,004,162 A | * 1/1977 | Kato et al. | 327/164 |
| 4,563,669 A | 1/1986 | Petschacher et al. | 341/118 |
| 4,920,344 A | 4/1990 | Henderson et al. | 341/126 |
| 5,254,994 A | 10/1993 | Takakura et al. | 341/153 |
| 5,257,027 A | 10/1993 | Murota | 341/153 |
| 5,625,360 A | 4/1997 | Garrity et al. | 341/144 |
| 5,689,258 A | 11/1997 | Nakamura et al. | 341/136 |
| 5,740,201 A | * 4/1998 | Hui | 375/286 |
| 5,815,104 A | 9/1998 | Jackson et al. | 341/144 |
| 5,852,378 A | 12/1998 | Keeth | 327/171 |
| 6,075,473 A | 6/2000 | Masuda | 341/118 |
| 6,198,777 B1 | * 3/2001 | Feher | 375/295 |
| 6,225,847 B1 | 5/2001 | Kim | 327/259 |
| 6,294,940 B1 | * 9/2001 | Kiehl | 327/291 |
| 6,768,438 B1 | 7/2004 | Schofield et al. | 341/144 |
| 6,842,132 B1 | 1/2005 | Schafferer | 341/144 |

FOREIGN PATENT DOCUMENTS

| | | |
|---|---|---|
| EP | 0 393 728 | 10/1990 |
| EP | 0 442 668 | 8/1991 |
| EP | 0 722 221 | 7/1996 |
| EP | 0940923 | 9/1999 |
| GB | A-2333191 | 7/1999 |

OTHER PUBLICATIONS

English language Search Report for United Kingdom Application GB 0120714.1, Apr. 2002.
A. Van den Bosch et al., "A 12 bit 200 MHz Low Glitch CMOS D/A Converter," IEEE 1998 Custom Integrated Circuits Conference, May 11, 1998.
Partial EPO Search Report (1 page), Munich, Germany, Nov. 2003.
Gyudong Kim, "A Digital to Analogue Converter for Direct Digital Modulation", (Ph.D. Dissertation), dated Jun. 28, 1996.

* cited by examiner

Primary Examiner—Peguy JeanPierre
(74) Attorney, Agent, or Firm—Staas & Halsey LLP

(57) ABSTRACT

Segmented mixed signal circuitry comprising a plurality of analog segments is disclosed. Each analog segment is operable to perform a series of switching operations dependent on an input data signal. The circuitry is arranged to receive shaped clock signals provided in common for all segments, and to perform each switching operation in a manner determined by the shape of the common shaped clock signals. The circuitry is suitable for use in digital to analog converters (DACs).

93 Claims, 9 Drawing Sheets

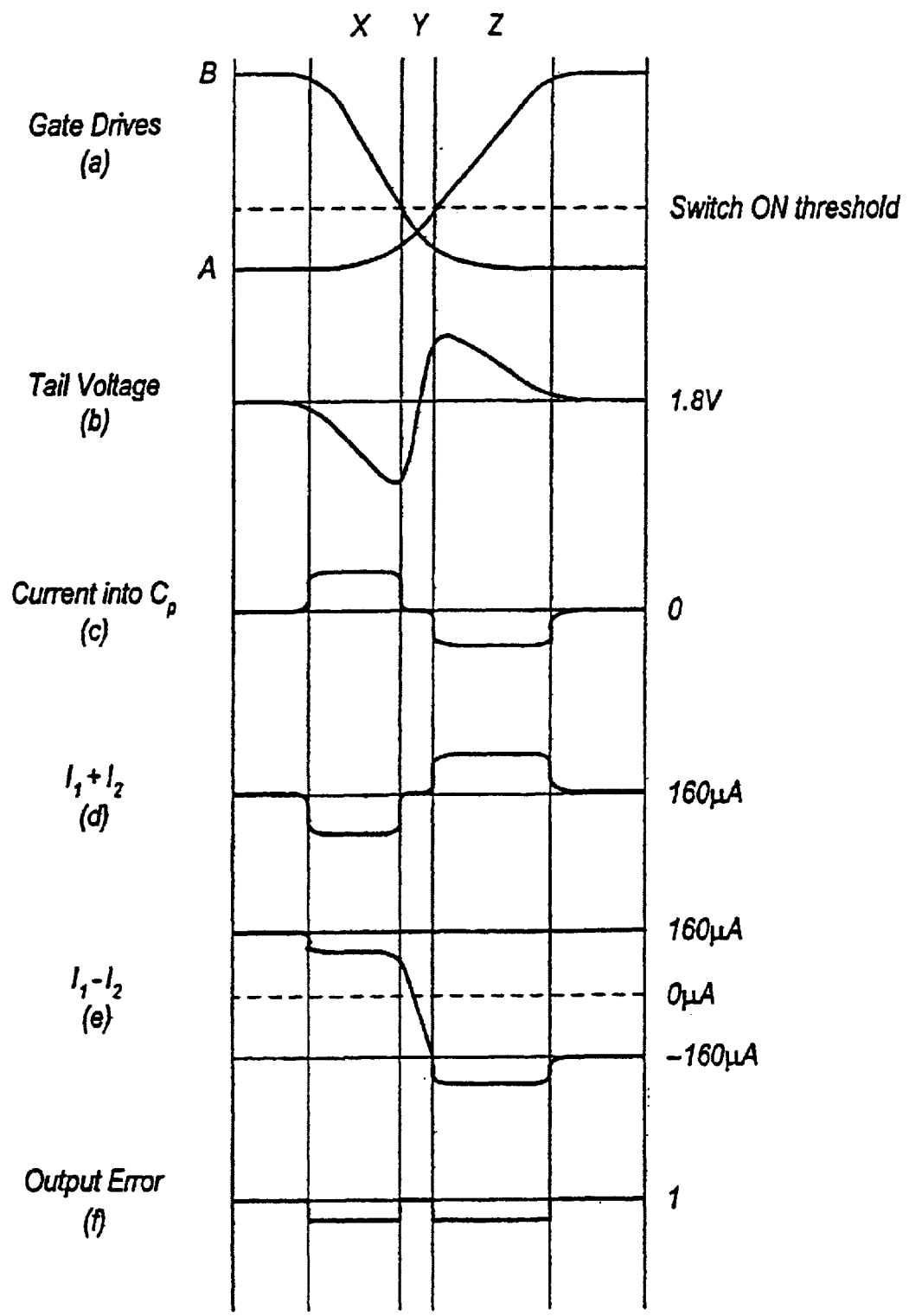
Fig.4    (PRIOR ART)

SWITCHING CIRCUITRY

BACKGROUND OF THE INVENTION

The present invention relates to segmented mixed signal circuitry for performing a series of switching operations, and to switching circuitry for use therein. The present invention has particular application in high speed digital to analog converters (DACs).

In known DACs, a plurality of analog circuits, or segments, are provided, each of which comprises a current source and a differential switching circuit. Each differential switching circuit comprises a first switch connected between the current source and a first output terminal, and a second switch connected between the current source and a second output terminal. At any one time, one of the switches is on, and the other switch is off, in order to switch the current from the current source to one of the two output terminals. Drive circuitry is also provided in order to supply drive signals for driving the various switches in dependence on an input digital data signal. The analog output signal is the voltage difference between a voltage produced by sinking the current at one output terminal into a resistance of value R, and the voltage produced by sinking the current at the other output terminal into another resistance of the same value R.

In the known DAC, it is important that the timings of the signals applied to the first and second switches in each segment are carefully controlled with respect to each other. For example, when the differential switching circuit changes state, it is usually necessary for the switch which is off to start turning on before the switch which is on starts turning off.

This requires one of the drive signals to be slightly in advance of the other drive signal and/or to change state faster than the other drive signal. Such control of the drive signals is referred to as shaping of the signals. If the signals are not correctly shaped, glitches may occur in the output signal, which may cause distortion in the analog output signal.

United Kingdom patent publication number GB 2333191 in the name of Fujitsu Limited, the entire subject matter of which is incorporated herein by reference, discloses a DAC having a plurality of analog segments, in which the shaping of the drive signals within each segment is carried out by circuitry provided locally in each segment. This arrangement serves to ensure that, within each segment, the switches change state at the correct times with respect to each other.

A problem which has been identified in known DACs is that random variations may occur from one segment to another in the times at which the various switches change state. These timing mis-matches may lead to distortion in the output signal of the DAC. Such mis-matches may be due at least in part to random variations in the characteristics of circuitry within each segment. For example, shaping circuitry which is present within each segment may itself lead to mis-matches in the switching times of different segments, due to random variations in the characteristics of transistors in the shaping circuitry.

SUMMARY OF THE INVENTION

According to a first aspect of the present invention there is provided segmented mixed signal circuitry comprising a plurality of analog segments each operable to perform a series of switching operations dependent on an input data signal, the circuitry being arranged to receive shaped clock signals provided in common for all segments, and to perform each switching operation in a manner determined by the shape of the common shaped clock signals.

By providing shaped clock signals in common to each of the analog segments, and arranging that the manner of the switching operations is determined by the shape of the clock signals, mis-matches in the timings of the switching operations may be reduced in comparison to the case where such common shaped clock signals are not provided. This may lead to reduced distortion in the output signal.

The invention may also provide the advantage that, because the shaped clock signals are provided in common for all segments, the circuitry required for producing the shaped clock signals can be made relatively complex and thus can achieve good control of the timings of the signals. If the shaping circuitry were provided locally, then such complex circuitry might be prohibitive due to the area occupied by the circuitry. In addition, since the shaped clock signals are provided in common, additional complex circuitry for producing the carefully shaped clock signals does not lead to additional delay mis-matches between the segments. This would not be the case if the shaping circuitry were provided locally in each segment.

By shaped clock signals it is preferably meant that at least two clock signals are provided, and that, of those, at least two clock signals have waveforms with different shapes. For example, two clock signals may be substantially complementary, but with differences in the shapes of their waveforms. The differences in the shapes of the waveforms may be due, for example, to the clock signals having clock edges which are offset from each other, and/or having clock edges which have different rise times and/or fall times, and/or some other type of shaping so that, if part of one clock signal were superimposed on the corresponding part of another clock signal, those parts would have waveforms which do not exactly correspond. The clock signals may be arranged, for example, so as to effect different parts of a switching operation in a different manner. For example, a switching operation may comprise turning one switch on and another switch off, and the shaped clock signals may be arranged so as to change the states of the switches in a manner which are slightly different from each other. For instance, the relative times at which the switches change state and the periods of time over which they change state may be controlled by the shaped clock signals. Different types of shaping to those mentioned above could also be used.

Preferably, each analog segment is arranged so as to draw a net current from a power supply which is substantially independent of the input data signal. This may provide the advantage that any variations in the supply voltage due to the drawn current are also independent of data. Any variations in the supply voltage may lead to variations in the switching times of switches in the segments. Thus, by ensuring that the net current drawn by each segment is independent of the input data, data dependent mis-matches in the switching times of the switches are reduced, which may reduce distortion in the output signal.

Each analog segment may be arranged such that the input data signal has a net current which is substantially independent of the data in the data signal. This may provide the advantage that there is no net data dependent current flow between the analog circuitry and the digital circuitry which supplies the input data signals. This can help to ensure the stability of the analog segments, and thus help to reduce distortion in the output signal The circuitry may be arranged such that the shaped clock signals have net currents which are substantially independent of the input data signal. This may help to prevent data dependent variations in the timings of the clock signals, which may help to reduce distortion in the output signal.

Each analog segment may comprise a differential switching circuit for performing the switching operations, and switch driver circuitry arranged to receive the input data signal and the shaped clock signals and to output drive signals to the differential switching circuit. Preferably the switch driver circuitry derives the drive signals from the shaped clock signals substantially without any reshaping of the shaped clock signals.

In known DACs, decoder circuitry is provided in order to convert incoming digital signals into signals for controlling the current sources. In high speed DACs, such decoder circuitry may not be able to keep up with the speed of the analog circuitry. It has therefore been proposed in United Kingdom patent publication number GB 2356301 in the name of Fujitsu Limited, the entire subject matter of which is incorporated herein by reference, to provide two (or more) decoder circuits, each of which decodes alternate samples of a digital input signal. By providing two decoder circuits, each of those circuits can operate at half of the operating speed of the DAC, which can allow the overall operating speed of the DAC to be higher than would otherwise be the case. In the arrangement of GB 2356301, a plurality of multiplexer circuits are provided for multiplexing the data signals produced by the two decoder circuits, before these signals are fed to the analog segments. A plurality of latching circuits are also provided for controlling the timings of each of the data signals.

The circuitry of the present invention may be used in situations such as that described above where two or more multiplexed input data signals are provided. In such cases, the data signals may be multiplexed before being applied to the analog segments. However, in preferred embodiments of the present invention, the analog segments themselves perform the multiplexing operations as well as the switching operations. This may be achieved by providing a plurality of driving circuits in each analog segment. Thus, the switch driver circuitry in each analog segment may comprise a plurality of switch driver circuits for receiving separate input data signals and separate shaped clock signals and for supplying drive signals to the differential switching circuit. The number of switch driver circuits in each segment may be, for example, two, four, or some other number, in dependence on the extent to which the input data signals are multiplexed.

Each switch driver circuit may comprise first and second data nodes for receiving complementary input data signals, a clock node for receiving a shaped clock signal, first and second output nodes for supplying drive signals to the differential switching circuit, a first switch for connecting the clock node to the first output node, and a second switch for connecting the clock node to the second output node, and the circuit may be arranged such that the first and second switches do not change state on a clock edge. By arranging that the switches which connect the clock node to the output nodes do not change state on a clock edge, random mismatches which may otherwise occur in the switching times of such switches may be eliminated. This may reduce random variations in timings of the switching operations of the various analog segments, which may reduce distortion in the output signal.

Each switch driver circuit may have a first state and a second state in dependence on the input data signals, and the clock node may be connected to the first output node in the first state and to the second output node in the second state. Preferably, the first switch is conductive and the second switch is non-conductive when the input data signals have a first state, and the second switch is conductive and the first switch is non-conductive when the input data signals have a second state.

The second output node may be connected to a node having a predetermined potential when the switch driver circuit is in the first state, and the first output node may be connected to the node having a predetermined potential when the switch driver circuit is in the second state. Such a predetermined potential may be, for example, a potential which is sufficient to ensure that a switch in the differential switching circuit is maintained in the non-conducting state. Each switch driver circuit may comprise a third switch for connecting the first output node to the node having a predetermined potential, and a fourth switch for connecting the second output node to the node having a predetermined potential, and the circuit may be arranged such that the third and fourth switches do not change state on a clock edge. This may also help to prevent random variations in the timings of the switching operations of the various analog segments. Preferably the third switch is non-conductive and the fourth switch is conductive when the input data signals are in the first state, and the third switch is non-conductive and the fourth switch is conductive when the input data signals are in the second state.

The switch driver circuits preferably do not include buffers which take a data dependent current connected to their data input nodes. This may help to ensure that the net current which passes between the digital circuitry and the analog circuitry is independent of the data, which may help to reduce distortion in the output signal.

A further problem which has been identified in known DACs is that third order distortion may be worse than would be expected. Third order distortion is particularly undesirable in DACs which produce multi-tone output signals, since third order intermodulation distortion may occur inband, in which case it cannot be removed by filtering. Such third order distortion is believed to be due in part to current flowing into and out of parasitic capacitances which may be present in the differential switching circuits.

In preferred embodiments of the present invention, the differential switching circuit in each analog segment comprises a plurality of switches for connecting a common node of the circuit to one of first and second nodes of the circuit in accordance with the input data signal, and the circuit is arranged such that the same number of switches change state in each cycle of the shaped clock signals. By arranging the same number of switches to change state in each cycle, the charge which flows into and out of the parasitic capacitances may be less dependent on the input data signal. This may help to reduce third order distortion which may occur in the analog output signal.

Furthermore, by arranging the same number of switches to change state in each cycle, the current drawn by each analog segment is approximately the same in each cycle. This may help to reduce variations in the timings of the switching operations of the various analog segments, which may lead to reduced distortion.

Each differential switching circuit may, for example, comprise first and third switches connected between the common node and the first node and second and fourth switches connected between the common node and the second node, and the circuit may be arranged such that, in at least one cycle of the shaped clock signals, one of the first and second switches is conductive in dependence on the input digital signal and the other switches are non-conductive, and, in at least one other cycle of the shaped clock signals, one of the third and fourth switches is conductive in dependence on the input digital signal and the other switches are non-conductive. For example, the circuitry may be operable in alternate first and second cycles of the shaped clock signals, and in the first cycles one of the first and second switches may be conductive and the other switches may be non-conductive, and in the second cycles one of the third and fourth switches may be conductive and the other switches may be non-conductive.

Generally, the differential switching circuit may comprise n pairs of switches, where n≧2, with one switch of each pair connected between the common node and the first node and the other switch of each pair connected between the common node and the second node, and the circuit may be operable in repeating sequences of n cycles, and the circuit may be arranged such that, in each cycle of a sequence, a different pair of switches is controlled such that one switch of the pair is conductive and the other switch of the pair is non-conductive in dependence on the input data signal, and the switches in the other pairs are non-conductive.

Where a plurality of switch driver circuits are provided, each drive circuit is preferably arranged to supply drive signals for a pair of switches.

The circuitry may further comprise a clock shaping circuit, provided in common for each of the analog segments, for supplying the shaped clock signals. As discussed above, such a clock shaping circuit can be made relatively complex, since it is provided in common for all analog segments, and thus it may achieve effective shaping of the clock signals.

The shaped clock signals may be arranged so as to effect different parts of a switching operation at different times. For example, the shaped clock signals may comprise two clock signals having clock edges offset from each other and/or the shaped clock signals may comprise two clock signals having clock edges with different rise times and/or fall times. More than two shaped clock signals may be provided if required.

As an example, an edge of a clock signal which causes a switch in the analog segment (for example, a switch in a differential switching circuit) to change from a conductive state to a non-conductive state may be delayed with respect to the corresponding edge of a clock signal which causes another switch in the analog segment to change from a non-conductive state to a conductive state. The clock signal with the delayed edge may be maintained at a substantially constant potential until the switch which is changing from the non-conductive state to the conductive state is at least partially conductive. This may help to ensure stable operation of the switching circuitry.

Each clock signal, when in a state which causes switches in the analog segment to be conductive, may have a potential which tracks changes in operating properties of the switches. Each clock signal, when in a state which causes a switch in the analog segment to be non-conductive, may have a potential substantially equal to the predetermined potential in the switch driver circuit. This may help to prevent glitches occurring in the output signal of the drive circuit.

The clock shaping circuit may take as its input two complementary clock signals. Any skew which is present in the input clock signals may cause inaccuracies in the timings of the shaped clock signals output from the clock shaping circuit. In this context, clock skew is where there are mis-matches in the clock edges of the complementary clock signals. The circuitry may therefore further comprise a skew compensation circuit for receiving two complementary input clock signals and for outputting to the clock shaping circuit two complementary output clock signals having reduced skew.

The skew compensation circuit may be arranged such that the output clock signals change their states at times determined by the slowest edges of the input clock signals. The output clock signals may then be high impedance during the periods between the fastest edges of the input clock signals and the corresponding slowest edges. For example, the skew compensation circuit may comprise first and second inverters for outputting the output clock signals, each inverter comprising two switches connected in series between a high potential and a low potential, and each inverter being arranged such that, when the input clock signals change state, a switch which is in a conductive state is changed to a non-conductive state at a time determined by the clock signal having the fastest clock edge, and a switch which is in a non-conductive state is changed to a conductive state at a time determined by the clock signal having the slowest clock edge.

A digital signal which is input to the segmented mixed signal circuitry may not necessarily be in a form in which it can directly control the switching operations of the analog segments. Thus the circuitry of the present invention may further comprise decoder circuitry for receiving an input digital signal and for outputting a data signal to each of the analog segments. As discussed above, such decoder circuitry may not be as fast as the analog circuitry. Thus the decoder circuitry may comprise a plurality of decoder circuits each of which is arranged to output a separate data signal to each of the analog segments. Where a plurality of switch driver circuits are provided in each analog segment, the decoder circuitry may comprise a plurality of decoder circuits each of which is arranged to output a data signal to one of the switch driver circuits in each of the analog segments. In such a case, each of the decoder circuits is preferably arranged such that its data signal changes state during a period in which the clock signal which is supplied to the corresponding drive circuit has a state which prevents a switch in the differential switching circuit from changing its state. Such an arrangement can allow the decoder circuitry a period of time in which its output signals may settle, without those signals being used to control switching operations in the analog segments.

In the segmented mixed signal circuitry of the present invention, each segment may be arranged to switch the current flowing from a current source or to a current sink. Such an arrangement may be used, for example, in a digital to analog converter, and thus there may be provided a digital to analog converter comprising circuitry in any of the forms described above.

The switch driver circuit discussed above may be provided independently, and thus, according to a second aspect of the present invention there is provided a switch driver circuit for driving a switching circuit, the switch driver circuit comprising a data node for receiving an input data signal, a clock node for receiving a clock signal, first and second output nodes for supplying drive signals to the switching circuit, a first switch for connecting the clock node to the first output node, and a second switch for connecting the clock node to the second output node, wherein the circuit is arranged such that the first and second switches do not change state when a clock signal received at the clock node changes state.

The switch driver circuit may have a first state and a second state in dependence on the input data signal, the clock node being connected to the first output node in the first state and to the second output node in the second state. The first switch may be conductive and the second switch may be non-conductive when the input data signal has a first state, and the second switch may be conductive and the first switch may be non-conductive when the input data signal has a second state. The second output node may be connected to a node having a predetermined potential when the switch driver circuit is in the first state, and the first output node may be connected to the node having a predetermined potential when the switch driver circuit is in the second state.

The switch driver circuit may comprise a third switch for connecting the first output node to the node having a predetermined potential, and a fourth switch for connecting the second output node to the node having a predetermined potential, and the circuit may be arranged such that the third and fourth switches do not change state on a clock edge. The third switch may be non-conductive and the fourth switch may be conductive when the input data signal is in the first state, and the third switch may be non-conductive and the fourth switch may be conductive when the input data signal is in the second state.

The switch driver circuit may be arranged such that the net current flowing through the data nodes is independent of the input data. Furthermore, the switch driver circuit may be arranged such that the net current flowing through the clock nodes is independent of the input data.

There may also be provided switch driver circuitry comprising a plurality of such driver circuits, each arranged to receive separate data signals and clock signals and to output drive signals for driving a common differential switching circuit having a plurality of switches.

The switching circuitry discussed above may also be provided independently, and thus, according to a third aspect of the present invention, there is provided switching circuitry operable in a series of clock cycles to connect a common node of the circuitry to one of first and second nodes of the circuitry in dependence on an input digital signal, the switching circuitry comprising a plurality of switches for connecting the common node to the first and second nodes, the circuitry being arranged such that, in operation, the same number of switches change state in each clock cycle.

The switching circuitry may comprise first and third switches connected between the common node and the first node and second and fourth switches connected between the common node and the second node, and the circuitry may be arranged such that, in at least one cycle of the series, one of the first and second switches is conductive in dependence on the input digital signal and the other switches are non-conductive, and, in at least one other cycle of the series, one of the third and fourth switches is conductive in dependence on the input digital signal and the other switches are non-conductive. For example, the switching circuitry may be operable in alternate first and second cycles, and in the first cycles one of the first and second switches may be conductive and the other switches may be non-conductive, and in the second cycles one of the third and fourth switches may be conductive and the other switches may be non-conductive.

Generally, the switching circuitry may comprise n pairs of switches, where n≧2, with one switch of each pair connected between the common node and the first node and other switch of each pair connected between the common node and the second node, and the circuitry may be operable in repeating sequences of n cycles, and the circuitry may be arranged such that, in each cycle of a sequence, a different pair of switches is controlled such that one switch of the pair is conductive and the other switch of the pair is non-conductive in dependence on the input data signal, and the switches in the other pairs are non-conductive.

The plurality of switches may be transistors, such as field effect transistors (FETs). For example, the switches may all be n-channel or p-channel MOSFETs (metal oxide semiconductor field effect transistors), although other types of transistors could be used instead.

As mentioned above, distortion in the output signal of a switching circuit may be caused by current flows into and out of parasitic capacitances in the switching circuit. The effect of such current flows may be reduced by providing one or more capacitative elements that cause complementary current flows. Thus the switching circuitry may further comprise a capacitative element connected to the common node, for compensating for the effect of current flow into capacitances associated with at least one of the plurality of switches. The capacitative element may be, for example, a transistor which is supplied with a signal which is at least approximately the complement of a clock signal which is supplied to the switching circuit. By this it is preferably meant that the signal which is supplied to the transistor is of opposite polarity to the clock signal for more than half of the time.

The switching circuitry may further comprise switch driver circuitry arranged to receive the input digital signal and a clock signal and to supplying drive signals to the plurality of switches.

The skew compensation circuitry described above may be used with circuitry other than the segmented mixed signal circuitry described above. According to a fourth aspect of the present invention there is provided skew compensation circuit for receiving two complementary input clock signals and for outputting two complementary output clock signals having reduced skew, the skew compensation circuit comprising first and second inverters for outputting the output clock signals, each inverter comprising two switches connected in series between a high potential and a low potential, and each inverter being arranged such that, when the input clock signals change state, a switch which is in a conductive state is changed to a non-conductive state at a time determined by the clock signal having the fastest clock edge, and a switch which is in a non-conductive state is changed to a conductive state at a time determined by the clock signal having the slowest clock edge. In each inverter, one switch may be a p-channel field effect transistor and the other switch may be an n-channel field effect transistor, and the two transistors may have separate inputs to their respective gates.

The skew compensation circuitry may further comprise a first NAND gate and a second NAND gate, the first NAND gate receiving at its input an input clock signal and the output of the second NAND gate, and the second NAND gate receiving at its input the complementary input clock signal and the output of the first NAND gate, outputs of the first and second NAND gates being supplied to control inputs of the switches in the first and second inverters. Each inverter may have one input connected to a non-inverted output of one of the NAND gates and the other input connected to the inverted output of the other NAND gate. The output clock signals may be high impedance during the periods between the fastest edges of the input clock signals and the corresponding slowest edges.

The present invention also provides method aspects corresponding to the various circuitry aspects described above. According to a fifth aspect of the invention there is provided a method of performing a series of switching operations in segmented mixed signal circuitry comprising a plurality of analog segments, the method comprising supplying shaped clock signals in common for all of the analog segments, and performing the series of switching operations, each switching operation being dependent on an input data signal, and being performed in a manner determined by the shape of the common shaped clock signals.

According to a sixth aspect of the invention there is provided a method of driving a switching circuit, the method comprising receiving an input data signal at a data node, receiving a clock signal at a clock node, and connecting the clock node to one of first and second output nodes via one of first and second switches in dependence on the input data signal, wherein the first and second switches do not change state when the clock signal changes state.

According to a seventh aspect of the invention there is provided a method of connecting a common node of a switching circuit to one of first and second nodes of the circuit in a series of cycles, the method comprising connecting the common node to one of the first and second nodes via one of a plurality of switches in each cycle, wherein the same number of switches change state in each cycle.

Apparatus features may be applied to the method aspects and vice versa. Features of any of the aspects of the invention may be applied to any of the other aspects.

Preferred features of the present invention will now be described, purely by way of example, with reference to the accompanying drawings.

BRIEF DESCRIPTION OF THE DRAWINGS

FIGS. 4(*a*)-(*f*) are schematic diagrams of various signals In the circuit of FIG. 3;

DETAILED DESCRIPTION OF THE INVENTION

Overview of a DAC

Figure 1:
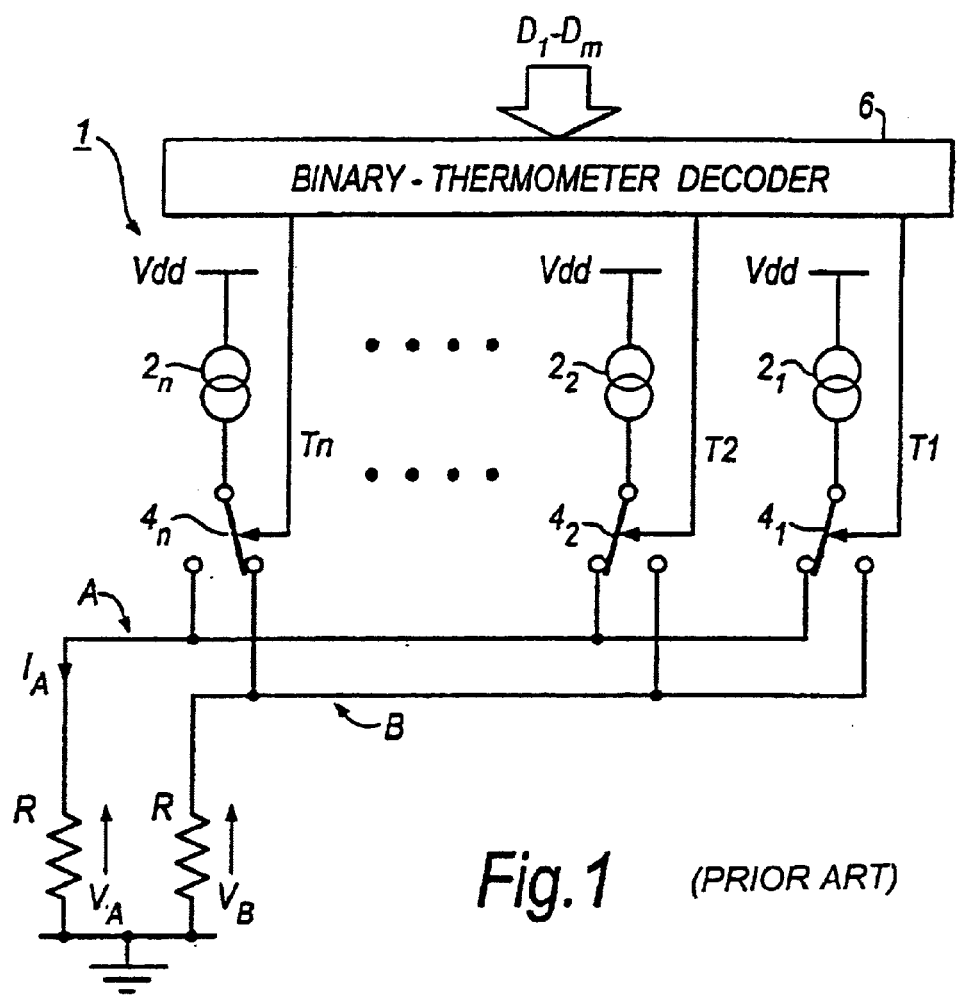
FIG. 1 shows an overview of a previously considered DAC.

FIG. 1 shows an overview of a previously considered DAC. The DAC in FIG. 1 is part of a DAC integrated circuit (IC) of the current-steering type, and is designed to convert an m-bit digital input word (D1–Dm) into a corresponding analog output signal.

Referring to FIG. 1, the DAC 1 contains analog circuitry including a number n of identical current sources $2_1$ to $2_n$, where $n=2^m-1$. Each current source 2 passes a substantially constant current I. The analog circuitry further includes a number n of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the first terminals of the differential switching circuit, and a second output current $I_B$ of the DAC 1 is the sum of the respective currents delivered to the second terminals of the differential switching circuit. The analog output signal is the voltage difference $V_A$-$V_B$ between a voltage $V_A$ produced by sinking the first output current $I_A$ of the DAC 1 into a resistance R and a voltage $V_B$ produced by sinking the second output current $I_B$ of the converter into another resistance R.

The thermometer-coded signals T1 to Tn are derived from the binary input word D1–Dm by digital circuitry including a binary-thermometer decoder 6. The decoder 6 operates as follows. When the binary input word D1–Dm has the lowest value the thermometer-coded signals T1–Tn are such that each of the differential switching circuits $4_1$ to $4_n$ selects its second terminal so that all of the current sources $2_1$ to $2_n$ are connected to the second connection line B. In this state, $V_A$=0 and $V_B$=nIR. The analog output signal $V_A$-$V_B$=-nIR. As the binary input word D1–Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1–Dm has the value i, the first i differential switching circuits $4_1$ to $4_i$ select their respective first terminals, whereas the remaining n–i differential switching circuits $4_{i+1}$ to $4_n$ select their respective second terminals. The analog output signal $V_A$-$V_B$ is equal to (2i-n)IR.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

Figure 2:
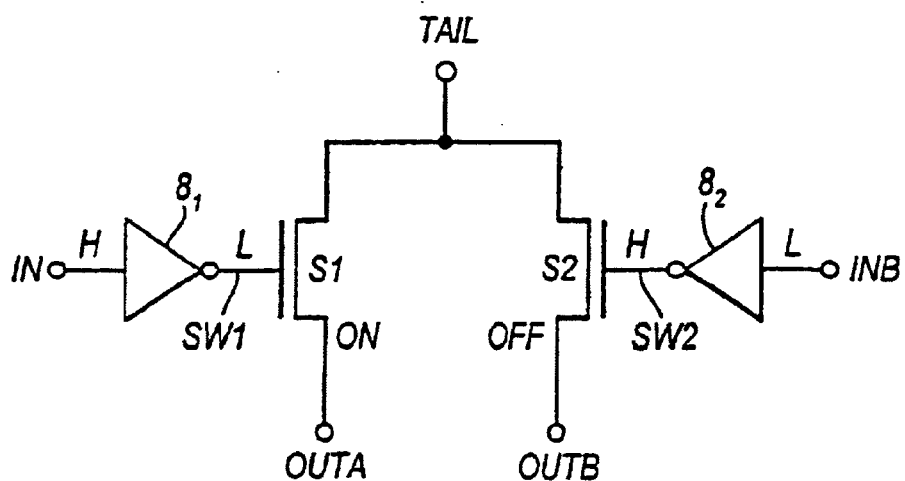
FIG. 2 shows a known differential switching circuit.

An exemplary differential switching circuit suitable for use with the DAC of FIG. 1 is shown in FIG. 2. This differential switching circuit comprises first and second PMOS field effect transistors (FETs) S1 and S2. The respective sources of the transistors S1 and S2 are connected to a common node TAIL to which a corresponding current source ($2_1$ to $2_n$ in FIG. 1) is connected. The respective drains of the transistors S1 and S2 are connected to respective first and second output nodes OUTA and OUTB of the circuit which correspond respectively to the first and second terminals of each of the differential switching circuits shown in FIG. 1.

Each transistor S1 and S2 has a corresponding driver circuit $8_1$ or $8_2$ connected to its gate. Complementary input signals IN and INB are applied respectively to the inputs of the driver circuits $8_1$ and $8_2$. Each driver circuit buffers and inverts its received input signal IN or INB to produce a switching signal SW1 or SW2 for its associated transistor S1 or S2 such that, in the steady-state condition, one of the transistors S1 and S2 is on and the other is off. For example, as indicated in FIG. 2, when the input signal IN has the high level (H) and the input signal INB has the low level (L), the switching signal SW1 (gate drive voltage) for the transistor S1 is at the low level L, causing that transistor to be ON, whereas the switching signal SW2 (gate drive voltage) for the transistor S2 is at the high level H, causing that transistor to be OFF. Thus, in this condition, all of the input current flowing into the common node TAIL is passed to the output node OUTA and no current passes to the output node OUTB.

When it is desired to change the state of the circuit of FIG. 2 so that the transistor S1 is OFF and the transistor S2 is ON, complementary changes are made simultaneously in the input signals IN and INB such that the input signal IN changes from H to L at the same time as the input signal INB changes from L to H. As a result of these complementary changes the transistor S1 turns OFF and the transistor S2 turns ON, so that all of the input current flowing into the common node TAIL is passed to the output node OUTB and no current passes to the output node OUTA.

Evaluations of DACs using known differential switching circuits have shown that third harmonic distortion is not as good as would be expected. Third harmonic distortion is particularly problematic in DACs which synthesis multi-tone output signals, because some of the distortion products fall in-band and thus cannot be filtered out. It has been discovered that parasitic capacitances which are present in the switching transistors may give rise to third order distortion.

Figure 3:
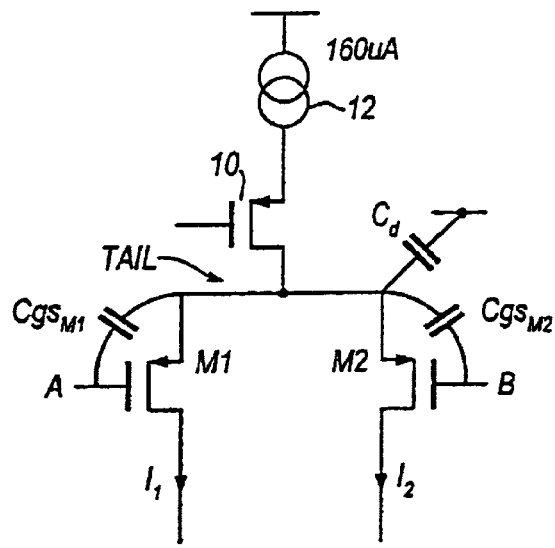
FIG. 3 shows a current source connected to a known differential switching circuit.

The mechanism by which parasitic capacitances lead to third order distortion will now be explained with reference to FIGS. 3 and 4. FIG. 3 shows a differential switching circuit comprising switching transistors M1 and M2 connected via a transistor 10 to a constant current source 12. The circuit of FIG. 3 corresponds to one of the current sources 2 and switching circuits 4 of FIG. 1. A signal A is input to the gate of the switch M1 and a signal B is input to the gate of the switch M2. Also shown in FIG. 3 are parasitic capacitances $Cgs_{M1}$ and $Cgs_{M2}$, which are the gate-source parasitic capacitances contributed by M1 and M2 respectively, and parasitic capacitance $C_d$, which is the combination of the drain capacitance of the device 10 and the capacitances of the source diodes of M1 and M2.

FIGS. 4(a)-(f) are schematic diagrams of various signals in the circuit of FIG. 3. As shown in FIG. 4(a), the gate drive to the switch M2 (signal B) is initialy high, and the gate drive to the switch M1 (signal A) is initially low. M1 and M2 are both active low, so that M1 is initially on and M2 is initially off. In the region X, signal B starts to fall, while signal A stays low. It is necessary for signal B to fall before signal A starts to rise to ensure that there is always a path for the current from the current source.

As signal B falls, the gate voltage to the switch M2 falls, and thus the voltage across the capacitance $Cgs_{M2}$ increases. This causes current to flow into $Cgs_{M2}$. This is shown in FIG. 4(c) by an increase of current into $C_P$. which is the combination of the parasitic capacitances on the tail node. This leads to a reduction in the tail voltage, as shown in FIG. 4(b). The current which flows into $C_P$ comes from the constant current source 12, resulting in a reduction in the value of $I_1+I_2$, as shown in FIG. 4(d) and a reduction in the value of $I_1-I_2$, as shown in FIG. 4(e).

In region Y, switch M2 starts to turn on as the gate drive B drops below the switch threshold voltage, and at the same time switch M1 starts to turn off as gate drive A increases. Assuming that the slew rates of A and B are the same, $Cgs_{M1}$ then injects charge into the tail at the same rate as $Cgs_{M2}$ removes charge, and so there is no net current flow into or out of the parasitic capacitance $C_p$.

In region Z, signal A rises, and so the voltage across $Cgs_{M1}$ decreases. Charge which is stored in $Cgs_{M1}$ is thus injected into the tail node. This extra current is added to the current from the constant current source 12, and so causes an increase in the value of $I_1+I_2$ (FIG. 4(d)) and a reduction in the value of $I_1-I_2$ (FIG. 4(e)).

The signal output by the switching circuit is proportional to $I_1-I_2$. An output error can therefore be derived from $I_1-I_2$, as shown in FIG. 4(f). It will be appreciated that the output error only occurs when the differential switching circuit is switching from one state to another.

The overall output error of the DAC due to the above mechanism is the sum of the output errors of each of the switching circuits. Thus, the overall output error will be higher when more of the switching circuits are switching, and lower when fewer of the switching circuits are switching. Thus the overall output error is dependent on the input data.

Incidentally, the currents which are injected and removed by the gate-drain parasitic capacitances (not shown) contributed by M1 and M2 always flow into and out of the same node, and therefore do not lead to any net changes in the output currents.

Figure 5:
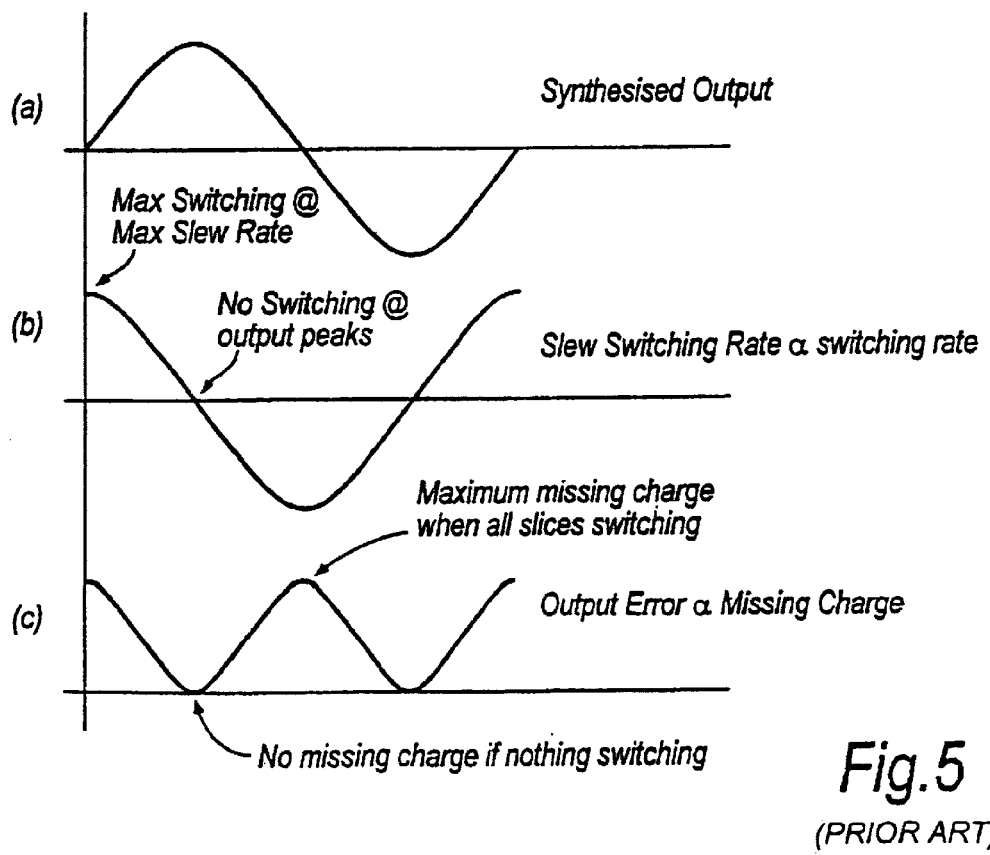
FIGS. 5(*a*)-(*c*) are schematic diagrams of the synthesised output, switching rate, and output error in a DAC.

FIGS. 5(a)-(c) show how the above mechanism is related to the third harmonic distortion. In the example of FIG. 5(a)-(c), a digital input signal applied to the DAC is used to synthesise a sine wave of frequency $f_0$ at the analog output of me DAC. FIG. 5(a) shows the synthesised output of the DAC, which is at the frequency $f_0$. FIG. 5(b) shows the slew rate of the output, which is proportional to the switching rate of the various switching circuits in the DAC, FIG. 5(c) shows the amount of missing charge in the output. The amount of missing charge is at a maximum when all switching circuits are switching, and is zero when no switching circuits are switching. The output error thus varies with a frequency $2f_0$. The output signal Is a product of the synthesised signal, which is at a frequency $f_0$, and the output error, which is at a frequency $2f_0$, which leads to distortion at a frequency of $3f_0$ (i.e. at the third harmonic).

Embodiments of the Invention

Embodiments of the present invention seek to reduce the third harmonic distortion by reducing the dependency of the output error on the input data. Embodiments of the invention also seek to reduce mis-matches in the switching times of differential switching circuits in DACs.

Figure 6:
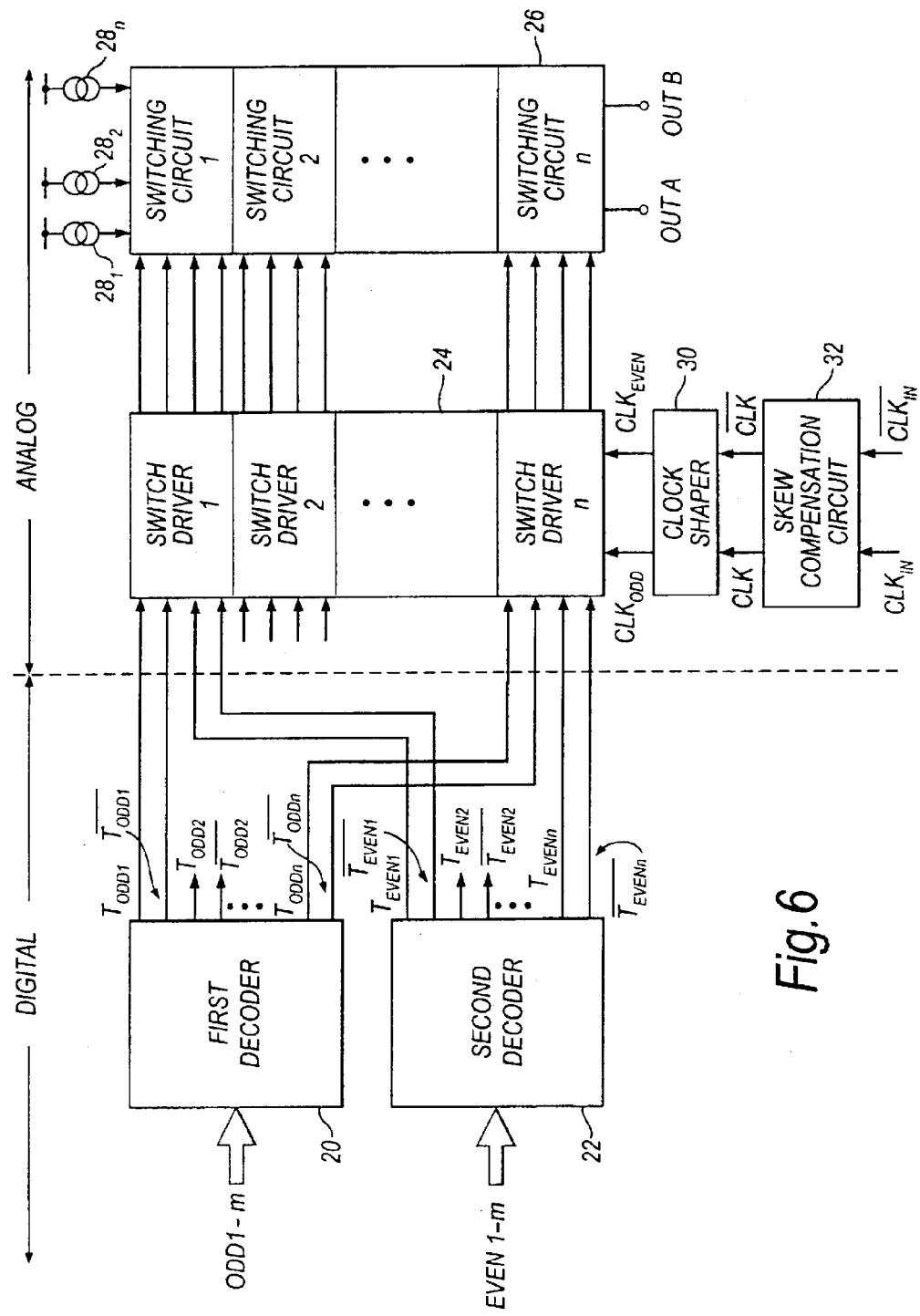
FIG. 6 shows an overview of a DAC according to an embodiment of the present invention.

FIG. 6 shows an overview of a DAC according to an embodiment of the present invention. The DAC may be used, for example, to synthesise the radio output signal in a mobile telephone base station. The DAC comprises first decoder circuit 20, second decoder circuit 22, switch driver circuitry 24, switching circuitry 26, current sources $28_1$ to $28_n$, clock shaper 30, and skew compensation circuit 32. The switch driver circuitry 24 comprises n switch drivers, and the switching circuitry 26 comprises n switching circuits.

In operation, the first decoder circuit 20 receives odd samples of a digital input signal and outputs n pairs of complementary thermometer coded signals $T_{ODD1}$ and $\overline{T}_{ODD1}$ to $T_{ODDn}$ and $\overline{T}_{ODDn}$. The second decoder circuit 22 receives even samples of a digital input signal and outputs n pairs of complementary thermometer coded signals $T_{EVEN1}$ and $\overline{T}_{EVEN1}$ to $T_{EVENn}$ and $\overline{T}_{EVENn}$. Since odd samples of the digital data signal are decoded by the first decoder 20, and even samples are decoded by the second decoder 22, each of these decoders can operate at half the speed than would be the case if only a single decoder were provided. This can allow the overall speed of the DAC to be increased. Further details of the decoder circuits 20, 22 are described in GB 2356301, cited above. If required, the outputs of the decoders could be latched in latch circuits (not shown).

Each pair of outputs from the first and second decoders is fed to a corresponding switch driver in the switch driver circuitry 24. For example, the outputs $T_{ODD1}$, $\overline{T}_{ODD1}$, $T_{EVEN1}$ and $\overline{T}_{EVEN1}$ are all fed to switch driver 1, and so on. Each switch driver also receives clock signals $CLK_{ODD}$ and $CLK_{EVEN}$ from the clock shaper 30. Each switch driver circuit produces four drive signals which are fed to the corresponding switching circuit in the switching circuitry 26. Each switching circuit also receives a current from one of the current sources $28_1$ to $28_n$, and switches that current to one of the two output terminals OUTA and OUTB in dependence on the drive signals received at its input.

Figure 7:
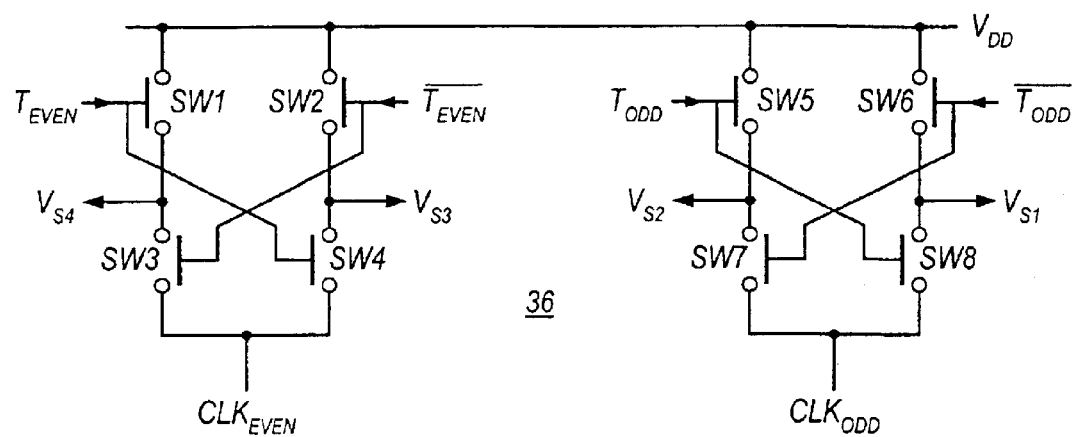
FIG. 7 shows a switch driver circuit in an embodiment of the invention.
Figure 8:
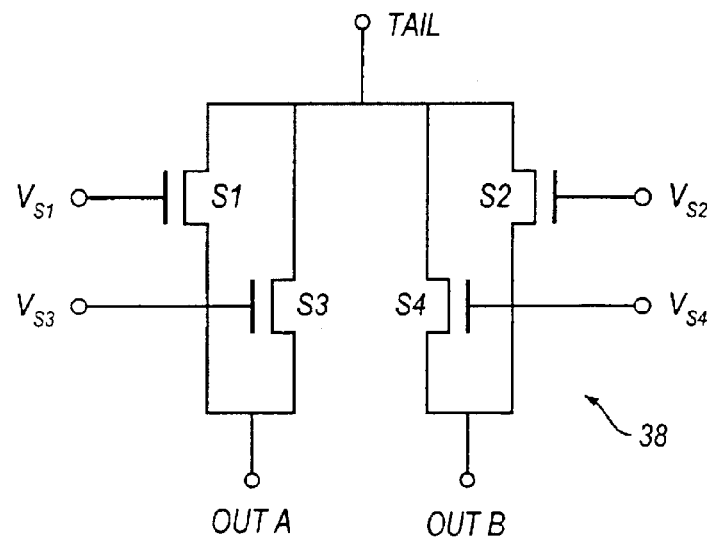
FIG. 8 shows a differential switching circuit in an embodiment of the invention.

FIGS. 7 and 8 show respectively a switch driver 36 and a differential switching circuit 38 in accordance with an embodiment of the present invention. The switch driver 36 is one of the switch drivers in the switch driver circuitry 24 of FIG. 6, and the differential switching circuit 38 is one of the switching circuits in the switching circuitry 26 shown in FIG. 6.

Referring to FIG. 7, switch driver 36 comprises a first switch driver circuit consisting of switches SW5 to SW8, and a second switch driver circuit consisting of switches SW1 to SW4. In operation, the first switch driver circuit receives the signals $T_{ODD}$ and $\overline{T}_{ODD}$ from the first decoder circuit 20 in FIG. 6 and the signal $CLK_{ODD}$ from the clock shaper 30 in FIG. 6. The second switch driver circuit receives the signals $T_{EVEN}$ and $\overline{T}_{EVEN}$ from the second decoder circuit 22 in FIG. 6, and the signal $CLK_{EVEN}$ from the clock shaper 30 in FIG. 6. The switches in the switch driver of FIG. 7 are active low, that is, they turn on when the voltage at their control input is low.

In the switch driver of FIG. 7, when $T_{EVEN}$ is low, the switches SW1 and SW4 are closed, and the switches SW2 and SW3 are open. When $T_{EVEN}$ is high, the switches SW1 and SW4 are open, and the switches SW2 and SW3 are closed. Thus, when $CLK_{EVEN}$ is high, both outputs $V_{S3}$ and $V_{S4}$ are high. When $CLK_{EVEN}$ is low, the output $V_{S3}$ follows $T_{EVEN}$, and the output $V_{S4}$ follows the inverse of $T_{EVEN}$. The switches SW5, SW6, SW7 and SW8 operate in a similar way in response to the signals $T_{ODD}$ and $CLK_{ODD}$. Thus, when $CLK_{ODD}$ is high both outputs $V_{S1}$ and $V_{S2}$ are high, and when $CLK_{ODD}$ is low, one of $V_{S1}$ and $V_{S2}$ is high and the other is low, in dependence on the value of $T_{ODD}$.

The following table summarises how the various output signals vary with the input and clock signals.

| $T_{ODD}$ | $T_{EVEN}$ | $CLK_{EVEN}$ | $CLK_{ODD}$ | $V_{S1}$ | $V_{S2}$ | $V_{S3}$ | $V_{S4}$ |
|---|---|---|---|---|---|---|---|
| 0 | 0 | 0 | 1 | 1 | 1 | 0 | 1 |
| 0 | 0 | 1 | 0 | 0 | 1 | 1 | 1 |
| 0 | 1 | 0 | 1 | 1 | 1 | 1 | 0 |
| 0 | 1 | 1 | 0 | 0 | 1 | 1 | 1 |
| 1 | 0 | 0 | 1 | 1 | 1 | 0 | 1 |
| 1 | 0 | 1 | 0 | 1 | 0 | 1 | 1 |
| 1 | 1 | 0 | 1 | 1 | 1 | 1 | 0 |
| 1 | 1 | 1 | 0 | 1 | 0 | 1 | 1 |

The outputs $V_{S1}$, $V_{S2}$, $V_{S3}$, $V_{S4}$ from the switch driver 36 in FIG. 7 are fed to the corresponding inputs $V_{S1}$, $V_{S2}$, $V_{S3}$, $V_{S4}$ in the differential switching circuit of FIG. 8.

Referring to FIG. 8, the differential switching circuit 38 has switches S1 and S3 connected between the node TAIL and the node OUTA, and switches S2 and S4 connected between the node TAIL and the node OUTB. The switches S1 to S4 have their control inputs driven by the signals $V_{S1}$ to $V_{S4}$ respectively which are provided by the switch driver circuit 36. The switches S1 to S4 are active low. Thus the switch S1 is off when the voltage $V_{S1}$ is high ("1") and on when the voltage $V_{S1}$ is low ("0"), and so forth.

In operation, the switching circuitry of FIGS. 7 and 8 acts to switch the current at the node TAIL to one of the nodes OUTA and OUTB in dependence on the input signals $T_{ODD}$, $\overline{T}_{ODD}$, $T_{EVEN}$ and $\overline{T}_{EVEN}$. In odd numbered cycles, the switches S1 and S2 are used to switch the current at the tail node to either OUTA and OUTB in dependence on the value of $T_{ODD}$ and $\overline{T}_{ODD}$. In even numbered cycles, the switches S3 and S4 are used to switch the current at the tail node to either OUTA and OUTB in dependence on the value of $T_{EVEN}$ and $\overline{T}_{EVEN}$. The values of $T_{ODD}$ and $\overline{T}_{ODD}$ are changed in even numbered cycles and the values of $T_{EVEN}$ and $\overline{T}_{EVEN}$ are changed in odd numbered cycles.

Thus the data signals $T_{ODD}$, $\overline{T}_{ODD}$, $T_{EVEN}$ and $\overline{T}_{EVEN}$ are set in advance of the relevant clock edge, so that it is the clock signals $CLK_{ODD}$ and $CLK_{EVEN}$ that control the timing of the changes in $V_{S1}$ to $V_{S4}$, rather than the data signals. This means that no special timing circuitry is needed for $T_{ODD}$, $\overline{T}_{ODD}$, $T_{EVEN}$ and $\overline{T}_{EVEN}$. If such timing circuitry were needed, the timing circuitry would have to be provided in every cell. However, in the present embodiment, a common clock shaper is provided for all cells. The clock shaper can be made as complex as necessary to achieve sufficiently good timing of the clock signals, without adding significantly to the overall amount of circuitry that is required.

Since the clock signals $CLK_{ODD}$ and $CLK_{EVEN}$ are fed by the switch driver 36 directly to the switches S1 to S4, there is a very short time delay between a clock edge and a corresponding change in the state of the switches. Because this time delay is short, any variations in the time delay will be small. Furthermore, since no switches (other than the final current steering switches) need to change state on a clock edge, there are no random mis-matches which might otherwise occur in the switching times of such switches. This means that mis-matches in the clock signals received by the various switching circuits are very small. Thus, any mis-matches in the timings of the various switching circuits within the DAC will also be small. For example, the DAC of the present embodiment may have timing mis-matches of less than 1 ps (e.g. 0.85 ps) whereas timing mis-matches in known DACs are around 8 ps. Reducing the timing mis-matches in this way can help to reduce distortion in the output signal.

In the switching circuitry of FIGS. 7 and 8, it is important that the clock signals $CLK_{ODD}$ and $CLK_{EVEN}$ have the same potential as $V_{DD}$ when they are high. If this were not the case, a glitch might occur in an output signal when an input signal changed and the corresponding clock signal was high. The clock signals $CLK_{ODD}$ and $CLK_{EVEN}$ are carefully controlled by the clock shaper circuit 30 shown in FIG. 6, as will be explained later.

As discussed above, in odd numbered cycles, one of the switches S1 and S2 is used to switch the current at the tail node to either OUTA and OUTB, and in even numbered cycles, one of the switches S3 and S4 is used to switch the current at the tail node to either OUTA or OUTB. Thus, whenever a new cyde begins, one of the switches turns on and another at the switches turns off. This means that the same number of switches change state in all clock cycles. regardless of the input data. By aranging the same number of switches to change state in all clock cycles, the gain error due to current flow into and out of the parasitic capacitances can be made independent of the input data. As was discussed above with reference to FIGS. 4(*a*)-(*f*) and 5(*a*)-(*c*), reducing the dependency of the output error on the input data may reduce the third order distortion that occurs in the output signal.

The circuitry shown in FIGS. 7 and 8 also has the advantage that the current taken by the circuitry from the power supply is independent of the input data. In particular, since the same number of switches in the switching circuit 36 change state in each clock cycle, the current drawn by the switching circuit is the same in each cycle. In addition, current taken by the switch driver 36 is also the same in each cycle, and thus does not depend on the input data. By arranging the current drawn by the circuit to be independent of the data, any variations in the supply voltage due to the drawn current are also independent of data. This may help to reduce data dependent mis-matches in the switching times of the switches, which may reduce distortion in the output signal.

Furthermore, the current drawn by the switch driver 36 and switching circuit 38 from the clock shaper 30 is approximately the same in each cycle. If different currents were drawn, this might affect the timings of the clocks, which would then affect the timings of the switches. By ensuring that the circuitry draws the same current from the clock shaper 30 in each cycle, any effect on the clock signals is likely to be the same in each cycle, leading to a reduction in timing mis-matches.

A further advantage of the switch driver 36 shown in FIG. 7 is that no net current is taken by the switch driver from the decoders 20, 22. This is because no node in the switch driver changes state when the input data signals change state. Since there is no net current flow, variations in the values of the signals from the decoders 20, 22 do not feed through to the switching circuits, and thus do not affect the switching times of the switches. This may also help to reduce mis-matches in switching times, and thus reduce the distortion in the output signal.

As shown in FIG. 6, the DAC circuitry is divided into a digital part and an analog part. The digital part and the analog part preferably have separate power supplies. As discussed above, the analog circuitry is arranged so as to draw a current which is the same in each clock cycle. This can allow the analog power supply to be well controlled at a substantially constant potential. This is important because variations in the analog power supply may feed through to the output signals. By contrast, the current taken by the digital circuitry does vary, and thus the potential of the digital power supply may vary. Provided that the potential of the digital power supply stays within defined limits, variations in the potential do not seriously affect the digital circuitry. In the present embodiment, since there is no net data dependent current flow between the digital circuitry and the analog circuitry, variations in the potential of the digital power supply have minimal effect on the analog circuitry.

If required, buffers could be inserted between the clock shaper 30 and the switch driver 36, or between the switch driver 36 and the switching circuit 38. Such buffers may be needed in order to help with the driving of the load. An example of a suitable buffer is a source follower. Since source followers do not switch, delay variations introduced by such source followers are small. Other types of buffer could be used where appropriate. However, it is preferable not to use buffers which are powered by the analog supply circuit between the decoders 20, 22 and the switch driver circuitry 24. This is because such buffers would taken a current which depended on the input data, which might disturb the analog supply. However, a balanced latch, such as that disclosed in United Kingdom patent publication number GB 2356750 in the name of Fujitsu Limited, the subject matter of which is incorporated herein by reference, could be inserted between the digital circuitry and the analog circuitry if required.

It will be appreciated from the above that the switching circuitry of FIGS. 7 and 8 performs the functions of clocking and multiplexing the input signals, as well as switching the current from the current source. Since all of these functions are combined in the switching circuitry, delays between the decoder circuitry and the switching circuitry are reduced in comparison to the case where separate circuits are provided to carry out these functions. Since the delays are reduced, delay mis-matches between the various signals are also reduced, which reduces the mis-matches in the times at which the various switching circuits switch the currents from their current sources. In addition, since only the final current steering transistors switch on a clock edge, random mis-matches in transistor switching times are minimised.

Figure 9:
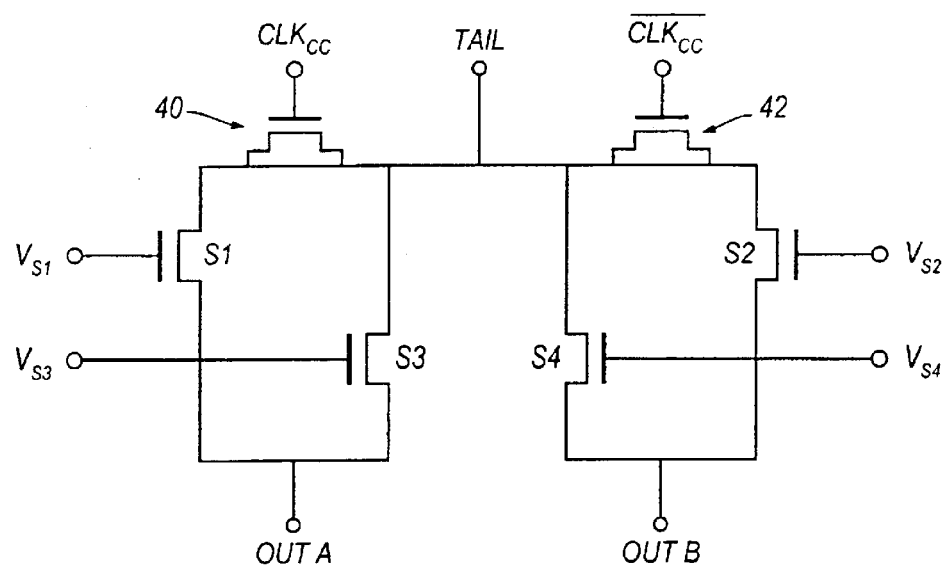
FIG. 9 shows a varient of the differential switching circuit of FIG. 8.
Figure 10:
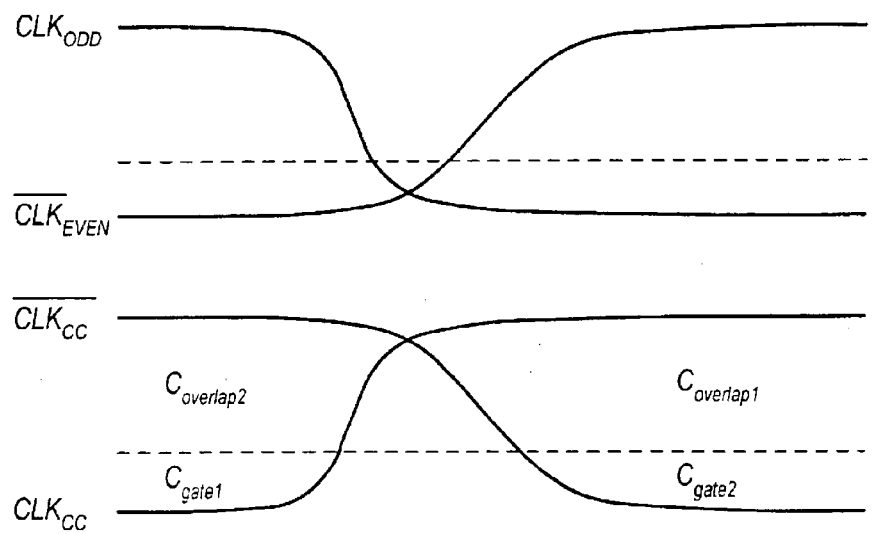
FIG. 10 shows waveforms which are applied to the circuit of FIG. 9.

A variant of the differential switching circuit 38 of FIG. 8 is shown in FIG. 9. The differential switching circuit of FIG. 9 is the same as the circuit of FIG. 8, but with two transistors 40, 42 connected to the node TAIL. These transistors switch on and off in the same way as the current steering switches, but in the opposite direction. They are used to help cancel out the charge injected/removed into the parasitic capacitances by the switches S1 to S4 as the voltages at their gates change. The gates of the transistors 40, 42 are connected to clock signals $CLK_{CC}$ and $\overline{CLK}_{CC}$ respectively. As shown in FIG. 10, these are the approximate inverse of the main clock signals $CLK_{ODD}$ and $CLK_{EVEN}$. The transistors 40, 42 therefore cause current flows which are opposite to the current flows caused by the parasitic capacitances contributed by S1 to S4. In this way, the transistors 40, 42 help to reduce the variations in the current flowing to the output terminals.

Clock Shaper Circuit

Figure 11:
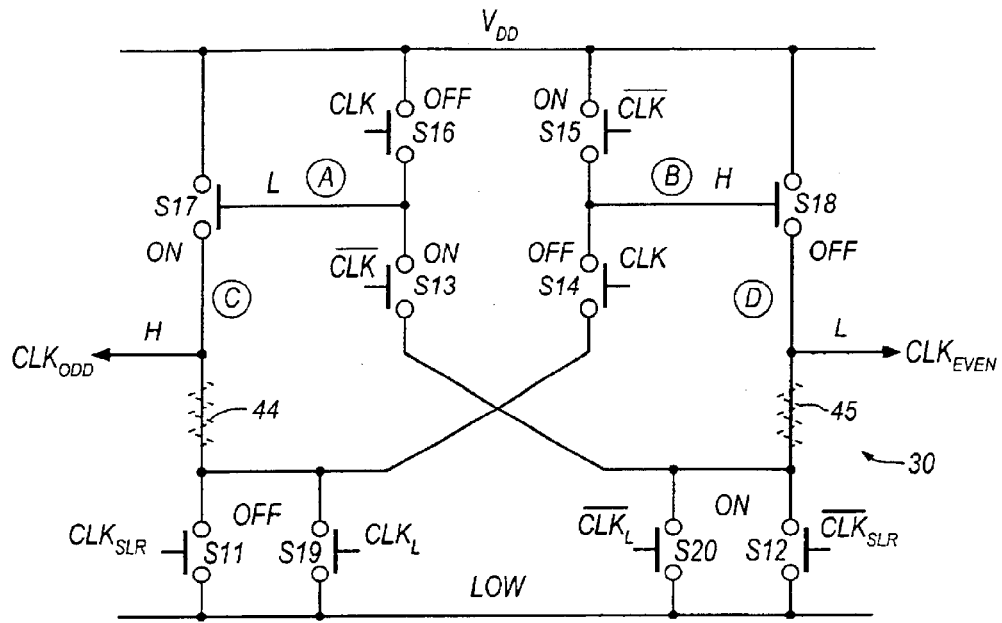
FIG. 11 shows a clock shaper circuit in an embodiment of the invention.

The clock signals $CLK_{ODD}$ and $CLK_{EVEN}$ which are applied to the switch driver circuitry in each segment are produced by the clock shaper circuit 30 of FIG. 6. Parts of the clock shaper circuit are shown in FIG. 11. The clock shaper circuit 30 comprises switches S11 to S20, connected as shown in FIG. 11. The switches may be, for example, PMOS FETs. In FIG. 11, CLK and its complement $\overline{CLK}$ are the input clocks which are at the DAC conversion frequency. $CLK_{SLR}$ and $\overline{CLK}_{SLR}$ are buffered versions of CLK and $\overline{CLK}$ that have slow rise times but fast fall times.

Figure 12:
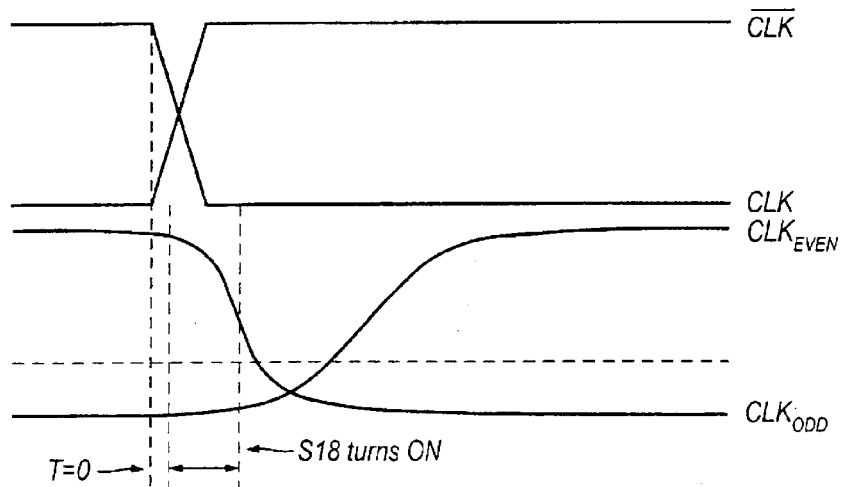
FIG. 12 shows various signals within the clock shaper circuit of FIG. 11.

Operation of the clock shaper circuit 30 will now be explained with reference to FIGS. 11 and 12. For the initial explanation, the switches S19 and S20 will be ignored; the purpose of these switches will be explained later. It is assumed that the initial states of the various switches are as shown in FIG. 11, that is, S11 is off, S12 is on, S13 is on, S14 is off, S15 is on, S16 is off, S17 is on and S18 is off. The output $CLK_{ODD}$ is therefore held high by S17, and the output $CLK_{EVEN}$ is held low by S12. At time T=0, CLK changes from high to low and $\overline{CLK}$ changes from low to high. In response to the change in the input clock the switches S13 to S16 change state immediately. This causes node A to be pulled high, turning switch S17 off, whilst node B connects via switch S14 to node C which is still high, keeping switch S18 off for the time being.

At T=Δ (where Δ is the delay of the buffers used to produce $CLK_{SLR}$ and $\overline{CLK}_{SLR}$) switch S11 turns on fast because $CLK_{SLR}$ has a fast fall time. This causes the output $CLK_{ODD}$ to be pulled to low. Node B is pulled down slowly to low because of the combination of the resistance of the switch S11 and the high gate capacitance of the pull-up switch S18, plus the load of all of the switch drivers. Switch S12 starts to turn off slowly because $\overline{CLK}_{SLR}$ has a slow rise time. This slow turn off holds $CLK_{EVEN}$ low until just before S18 turns on. S18 turns on when node B has reached the switch threshold voltage. Since node B is connected via S14 to node C, S18 only turns on once the output $CLK_{ODD}$ has fallen below the switch threshold voltage. When S18 turns on, the output $CLK_{EVEN}$ is then pulled to high.

It is important that the low output of $CLK_{EVEN}$ does not vary very much before it starts to rise, because this output is connected directly to the differential switching circuit, and so any movement in the value of $CLK_{EVEN}$ will result in movement in the tail voltage $V_{TAIL}$. For this reason it is important that S12 stays on until just before S18 turns on. If S12 were to turn off too early then the low output signal would be floating, which would also lead to variations in the output signal. However, if S12 were on at the same time as S18, shoot-though current through S18 and S12 would disrupt the low output signal. The timing of the switches S12 and S18 is therefore set up so that, taking into account all process, voltage and temperature (PVT) variations there will be no shoot through. In practice this means that S12 tends to turn off slightly early, but this is tolerated to achieve satisfactory performance over all PVT variations.

On the next clock edge, when CLK changes from low to high and $\overline{CLK}$ changes from high to low, corresponding changes to those described above take place, so that the output $CLK_{EVEN}$ first starts to fall to low, and the output $CLK_{ODD}$ only starts to rise once $CLK_{EVEN}$ has reached the switch threshold voltage.

The resistors 44, 45 shown in FIG. 11 are resistors which have been added to the output clock path. These resistors allow adjustments to be made in the timings of the output clock signals by adjusting the pull down rates of the signals.

Next to each of the main pull-down switches S11 and S12 is a smaller sized switch S19 and S20. These switches are used to absorb some of the injected charge pumped into the low output signal as a result of clock feed-through of the large switches S11 and S12 when they are turned off. For example, when S12 turns off, $CLK_{EVEN}$ momentarily enters a high impedance state. Any charge injected into node D through the gate-source capacitance of switch S12 will cause variations in the low output of $CLK_{EVEN}$. The switches S19 and S20 are driven by control signals $CLK_L$ and $\overline{CLK}_L$, which are derived from the buffers used to generate $CLK_{SLR}$ and $\overline{CLK}_{SLR}$. The switches S19 and S20 are therefore turned on slightly later than their corresponding switches S11 and S12 to absorb the injected charge caused by the slow control signals of S11 and S12. The size of the switches S19 and S20 is a compromise between absorbing as much of the injected charge as possible, without injecting too much charge themselves. In practice the switches S19 and S20 may be about a quarter of the size of S11 and S12. Further such switches of even smaller size could also be provided if required, with suitable drive circuitry.

The low voltage of the clock shaper circuit 30 is set to give the required voltage swing of the output clock signals $CLK_{ODD}$ and $CLK_{EVEN}$. The required voltage swing is related to the gate-source voltage of the switches in the differential switching circuit in each analog cell. In the present embodiment, the voltage at the node TAIL is about 1.8V. To ensure that there is sufficient voltage swing despite variations in process, voltage and temperature, the low output from the clock shaper circuit tracks the threshold voltage $V_T$ and the saturation drain-source voltage $V_{DS(sat)}$ of the switches S1, S2, S3 and S4 in FIG. 8.

Figure 13:
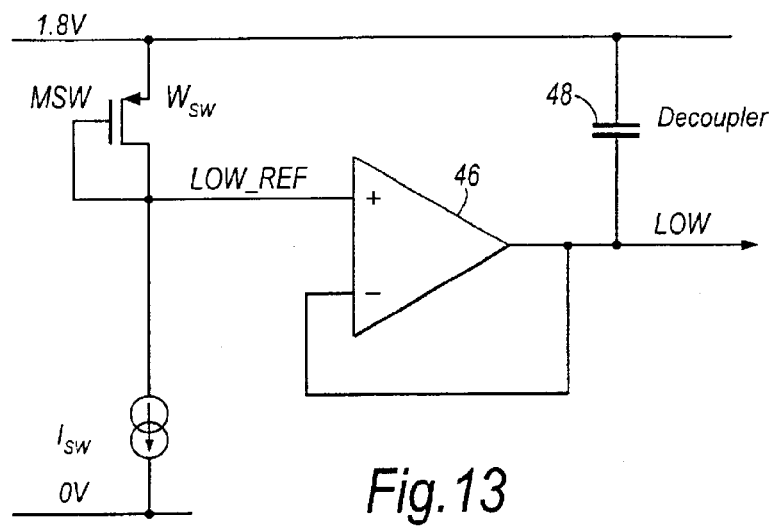
FIG. 13 shows a low voltage generator for use with the clock shaper circuit of FIG. 11.

FIG. 13 shows a circuit which is used to set the low voltage of the clock shaper circuit 30. The device MSW is a switch which is made as similar to the switches S1 to S4 as possible, and is placed as close to those switches as possible. The output amplifier 46 is designed to supply the required current to the clock shaper circuit. The decoupling capacitor 48 is provided to supply the fast current spikes drawn from the circuit.

Skew Compensation Circuit

Figure 14:
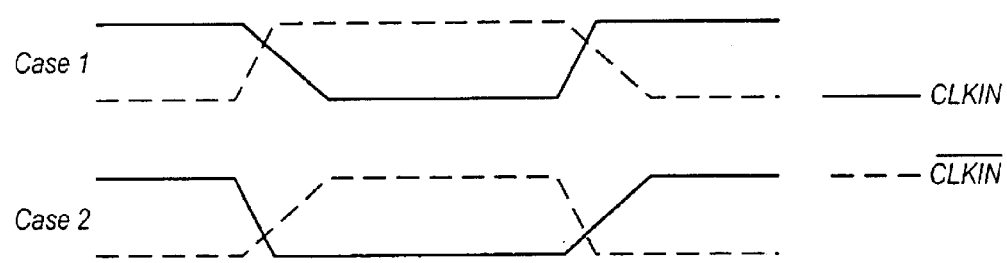
FIG. 14 shows examples of clock skew.

If the signals CLK and $\overline{CLK}$ which are input to the clock shaper circuit are skewed, then the timing of the switches in the clock shaper circuit may change, and undesired shoot-through of current may occur. Clock skew occurs where a clock signal and its complement have clock edges which do not change at identical times. FIG. 14 shows two examples of clock skew. In the first example, each clock signal changes from low to high before its complement changes from high to low. In the second example, each clock signal changes from high to low before its complement changes from low to high. Any combinations of the two cases could also occur.

In order to compensate for clock skew, a clock skew compensation circuit 32 is provided at the input to the clock shaper circuit 30, as shown in FIG. 6. Clock skew compensation circuit 32 receives input clock signals $CLK_{IN}$ and $\overline{CLK}_{IN}$, and outputs clock signals CLK and $\overline{CLK}$. The circuit is arranged so that the output clock signals always change state using the input clock with the slowest edge.

Figure 15:
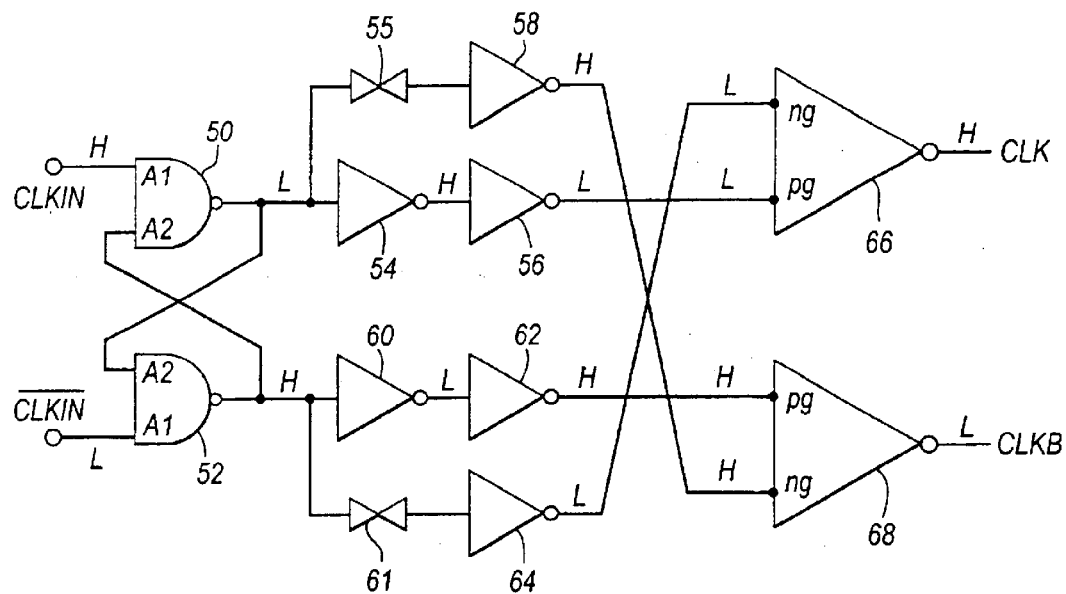
FIG. 15 shows a skew compensation circuit in an embodiment of the present invention.
Figure 16:
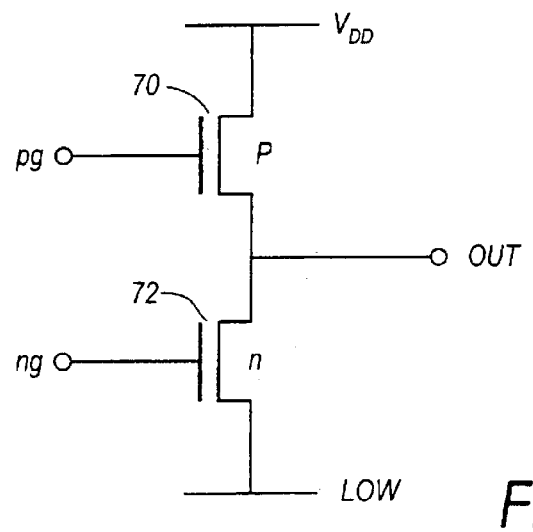
FIG. 16 shows an inverter with separate pgate and ngate inputs.

FIG. 15 shows parts of the clock skew compensation circuit 32. The clock skew compensation circuit comprises NAND gates 50, 52, inverters 54, 56, 58, 60, 62, 64, switches 55, 61, and dual input inverters 66, 68. Each of the inverters 66, 68 comprises a p-channel MOSFET 70 and an n-channel MOSFET 72 with separate pgate (pg) and ngate (ng) inputs, as shown in FIG. 16.

Referring to FIG. 15, NAND gate 50 receives the signal $CLK_{IN}$ at one input, and an output from NAND gate 52 at the other input. NAND gate 52 receives the signal $\overline{CLK_{IN}}$ at one input, and an output from NAND gate 50 at the other input. NAND gates 50 and 52 thus form a flip-flop circuit. The output from NAND gate 50 is fed via inverters 54 and 56 to the pgate input of inverter 66, and via switch 55 and inverter 58 to the ngate input of inverter 68. The output from NAND gate 52 is fed via inverters 60 and 62 to the pgate input of inverter 68, and via switch 61 and inverter 64 to the ngate input of inverter 66. The switches 55 and 61 are provided to introduce the same delays as those caused by inverters 54 and 60.

If, as indicated in FIG. 15, $CLK_{IN}$ is high and $\overline{CLK_{IN}}$ is low, the output of NAND gate 50 is low and the output of NAND gate 52 is high. When the input clock signals $CLK_{IN}$ and $\overline{CLK_{IN}}$ change, the output of NAND gate 50 goes high either when $CLK_{IN}$ goes low or when $\overline{CLK_{IN}}$ goes high, whichever occurs first. However, the output of NAND gate 52 only goes low when both $CLK_{IN}$ is low and $\overline{CLK_{IN}}$ is high. Thus the output of NAND gate 50 changes on the first clock edge of the input clocks, and the output of NAND gate 52 changes on the last clock edge of the input clocks. NAND gates 50, 52 function in the opposite way when $CLK_{IN}$ changes from low to high and $\overline{CLK_{IN}}$ changes from high to low, so that the output of NAND gate 52 changes on the first clock edge and the output of NAND gate 50 changes on the last clock edge. Thus it can be seen that whichever NAND gate has a high input will change state on the first clock edge, and whichever NAND gate has a low input will change state on the last clock edge. Thus the output of a NAND gate always changes from low to high on the first clock edge and from high to low on the last clock edge.

Inverter 66 receives a non-inverted buffered output from NAND gate 50 at its pgate input, and an inverted buffered output from NAND gate 52 at its ngate input. Similarly, inverter 68 receives a non-inverted buffered output from NAND gate 52 at its pgate input, and an inverted buffered output from NAND gate 50 at its ngate input. Thus, the pgate input of each of the inverters 66, 68 always changes from low to high on the first edge of the input clocks, and from high to low on the last edge of the input clocks. Similarly, the ngate input always changes from high to low on the first edge and from low to high on the last edge. This ensures that the transistors 70, 72 in FIG. 16 are never both on at the same time. Between the first clock edge and the last clock edge, both transistors are off and the output of the inverter is high impedance.

The clock skew compensation circuit 32 also provides the buffering which is required between the signals $CLK_{IN}$ and $\overline{CLK_{IN}}$ and the inputs CLK and $\overline{CLK}$ to the clock shaper circuit 30. Such buffering would be required in any case in order to provide the necessary drive current for the load presented by the clock shaper circuit, and therefore the skew compensation circuit 32 adds little in the way of complexity to the overall circuit design.

The skew compensation circuit 32 may be used with DAC designs other than that described above. The skew compensation circuit 32 may also be used in timing sensitive applications other than DACs.

Although the foregoing embodiments have employed p-channel switching transistors in the differential switching circuits, it will be appreciated that the present invention can be applied in other embodiments to current switching circuitry employing n-channel switching transistors (and a current sink in place of the current source). In this case, the polarities of the supply lines and the conductivity types of the transistors in the switch driver circuitry are reversed.

While embodiments of the present invention have been described with reference to a DAC using thermometer coding, other types of coding may be used. In a DAC to which the present invention may be applied, each of the current sources may pass substantially the same current, or they may pass different currents.

Although the foregoing embodiments have been adapted for use in a DAC, it will be appreciated that in other embodiments the present invention can be applied to any suitable kind of mixed-signal circuitry where one or more digital signals for application to analog circuitry must be generated at a high frequency. For example, the invention can also be applied in programmable current generation, in mixers and in analog-to-digital converters.

What is claimed is:

1. Segmented mixed signal circuitry comprising a plurality of analog segments each operable to perform a series of switching operations dependent on an input data signal, the circuitry being arranged to receive shaped clock signals provided in common for all segments, and to perform each switching operation in a manner determined by the shape of the common shaped clock signals.

2. Circuitry according to claim 1, wherein each analog segment is arranged so as to draw a net current from a power supply which is substantially independent of the input data signal.

3. Circuitry according to claim 1, wherein each analog segment is arranged such that the input data signal has a net current which is substantially independent of the data in the data signal.

4. Circuitry according to claim 1, wherein the circuitry is arranged such that the shaped clock signals have net currents which are substantially independent of the input data signal.

5. Circuitry according to claim 1, wherein each analog segment comprises a differential switching circuit for performing the switching operations, and switch driver circuitry arranged to receive the input data signal and the shaped clock signals and to output drive signals to the differential switching circuit.

6. Circuitry according to claim 5, the switch driver circuitry in each analog segment comprising a plurality of switch driver circuits for receiving separate input data signals and separate shaped clock signals and for supplying drive signals to the differential switching circuit.

7. Circuitry according to claim 6, each switch driver circuit comprising first and second data nodes for receiving complementary input data signals, a clock node for receiving a shaped clock signal, first and second output nodes for supplying drive signals to the differential switching circuit, a first switch for connecting the clock node to the first output node, and a second switch for connecting the clock node to the second output node, wherein the circuit is arranged such that the first and second switches do not change state on a clock edge.

8. Circuitry according to claim 7, wherein each switch driver circuit has a first state and a second state in dependence on the input date signals, the clock node being connected to the first output node in the first state and to the second output node in the second state.

9. Circuitry according to claim 7, wherein the first switch is conductive and the second switch is non-conductive when the input data signals have a first state, and the second switch is conductive and the first switch is non-conductive when the input data signals have a second state.

10. Circuitry according to claim 9, wherein the second output node is connected to a node having a predetermined potential when the switch driver circuit is in the first state, and the first output node is connected to the node having a predetermined potential when the switch driver circuit is in the second state.

11. Circuitry according to claim 10, each switch driver circuit comprising a third switch for connecting the first output node to the node having a predetermined potential, and a fourth switch for connecting the second output node to the node having a predetermined potential, the circuit being arranged such that the third and fourth switches do not change state on a clock edge.

12. Circuitry according to claim 11, wherein the third switch is non-conductive and the fourth switch is conductive when the input data signals are in the first state, and the third switch is non-conductive and the fourth switch is conductive when the input data signals are in the second state.

13. Circuitry according to claim 7, wherein the switch driver circuits do not include buffers which take a data dependent current connected to their data input nodes.

14. Circuitry according to claim 6 further comprising decoder circuitry for receiving an input digital signal, the decoder circuitry comprising a plurality of decoder circuits each of which is arranged to output a date signal to one of the switch driver circuits in each of the analog segments.

15. Circuitry according to claim 14, wherein each of the digital circuits is arranged such that its data signal changes state during a period in which the clock signal which is supplied to the corresponding drive circuit has a state which prevents a switch in the differential switching circuit from changing its state.

16. Circuitry according to claim 5, wherein the differential switching circuit in each analog segment comprises a plurality of switches for connecting a common node of the circuit to one of first and second nodes of the circuit in accordance with the input data signal, the circuit being arranged such that the same number of switches change state in each cycle of the shaped clock signals.

17. Circuitry according to claim 16, the differential switching circuit comprising first and third switches connected between the common node and the first node and second and fourth switches connected between the common node and the second node, wherein the circuit is arranged such that, in at least one cycle of the shaped clock signals, one of the first and second switches is conductive in dependence on the input digital signal and the other switches are non-conductive, and, in at least one other cycle of the shaped clock signals, one of the third and fourth switches is conductive in dependence on the input digital signal and the other switches are non-conductive.

18. Circuitry according to claim 17, operable in alternate first and second cycles of the shaped clock signals, wherein in the first cycles one of the first and second switches is conductive and the other switches are non-conductive, and in the second cycles one of the third and fourth switches is conductive and the other switches are non-conductive.

19. Circuitry according to claim 16, the differential switching circuit comprising n pairs of switches, where $n \geq 2$, with one switch of each pair connected between the common node and the first node and the other switch of each pair connected between the common node and the second node, the circuit being operable in repeating sequences of n cycles, wherein the circuit is arranged such that, in each cycle of a sequence, a different pair of switches is controlled such that one switch of the pair is conductive and the other switch of the pair is non-conductive in dependence on the input data signal, and the switches in the other pairs are non-conductive.

20. Circuitry according to claim 19, wherein each drive circuit is arranged to supply drive signals for a pair of switches.

21. Circuitry according to claim 1, further comprising a clock shaping circuit, provided in common for each of the analog segments, for supplying the shaped clock signals.

22. Circuitry according to claim 21, wherein the shaped clock signals are arranged so as to effect different parts of a switching operation at different times.

23. Circuitry according to claim 21, wherein the shaped clock signals comprise two clock signals having clock edges offset from each other.

24. Circuitry according to claim 21, wherein the shaped clock signals comprise two clock signals having clock edges with different rise times and/or fall times.

25. Circuitry according to claim 21, wherein an edge of a clock signal which causes a switch in the analog segment to change from a conductive state to a non-conductive state is delayed with respect to the corresponding edge of a clock signal which causes another switch in the analog segment to change from a non-conductive state to a conductive state.

26. Circuitry according to claim 25, wherein the clock signal with the delayed edge is maintained at a substantially constant potential until the switch which is changing from the non-conductive state to the conductive state is at least partially conductive.

27. Circuitry according to claim 21, wherein each clock signal, when in a state which causes a switch in the analog segment to be conductive, has a potential which tracks changes in operating properties of the switch.

28. Circuitry according to claim 21, wherein each clock signal, when in a state which causes a switch in the analog segment to be non-conductive, has a potential substantially equal to said predetermined potential.

29. Circuitry according to claim 21, further comprising a skew compensation circuit for receiving two complementary input clock signals and for outputting to the clock shaping circuit two complementary output clock signals having reduced skew.

30. Circuitry according to claim 29, wherein the skew compensation circuit is arranged such that the output clock signals change their states at times determined by the slowest edges of the input clock signals.

31. Circuitry according to claim 30, wherein the output clock signals are high impedance during the periods between the fastest edges of the input clock signals and the corresponding slowest edges.

32. Circuitry according to claim 29, the skew compensation circuit comprising first and second inverters for outputting the output clock signals, each inverter comprising two switches connected in series between a high potential and a low potential, and each inverter being arranged such that, when the input clock signals change state, a switch which is in a conductive state is changed to a non-conductive state at a time determined by the clock signal having the fastest clock edge, and a switch which is in a non-conductive state is changed to a conductive state at a time determined by the clock signal having the slowest clock edge.

33. Circuitry according to claim 1, further comprising decoder circuitry for receiving an input digital signal and for outputting a data signal to each of the analog segments.

34. Circuitry according to claim 1, wherein each segment is arranged to switch the current flowing from a current source or to a current sink.

35. A digital to analog converter having segmented mixed signal circuitry comprising a plurality of analog segments each operable to perform a series of switching operations dependent on an input data signal, the circuitry being arranged to receive shaped clock signals provided in common for all segments, and to perform each switching operation in a manner determined by the shape of the common shaped clock signals.

36. A switch driver circuit, for driving a differential switch circuit, the switch driver circuit comprising:
a data node at which an input data signal is received;
a clock node at which a clock signal is received;
a first signal supply path from the clock node to a first output node at which a first drive signal is output to the differential switch circuit, said first path including a first switch;
a second signal supply path from the clock node to a second output node at which a second drive signal is output to the differential switch circuit, said second path including a second switch;
each said switch being switchable in dependence upon a vlaue of the data signal between an on state and an off state;
said switch driver circuit being operable, prior to a change in the clock signal from an inactive state, to set the switch in one of the two signal supply paths to the on state and to set the switch in the other of the two signal supply paths to the off state in dependence upon a next value of the data signal, so that when said change subsequently occurs the clock signal or a signal derived therefrom is supplied, via the signal supply path having the on switch, to the output node of that path without having to turn on that switch.

37. The switch driver circuit according to claim 36, the switch driver circuit having a first state and a second state in dependence on the input data signal, the clock node being connected to the first output node in the first state and to the second output node in the second state.

38. The switch driver circuit according to claim 36, wherein the first switch is conductive and the second switch is non-conductive when the input data signal has a first state, and the second switch is conductive and the first switch is non-conductive when the input data signal has a second state.

39. The switch driver circuit according to claim 38, wherein the second output node is connected to a node having a predetermined potential when the switch driver circuit is in the first state, and the first output node is connected to the node having a predetermined potential when the switch driver circuit is in the second state.

40. The switch driver circuit according to claim 39, comprising a third switch for connecting the first output node to the node having a predetermined potential, and a fourth switch for connecting the second output node to the node having a predetermined potential, the circuit being arranged such that the third and fourth switches do not change state on a clock edge.

41. The switch driver circuit according to claim 40, wherein the third switch is non-conductive and the fourth switch is conducive when the input data signal is in the first state, and the third switch is non-conductive and the fourth switch is conductive when the input data signal is in the second state.

42. The switch driver circuit according to claim 36, wherein the circuit is arranged such that the net current flowing through the data nodes is independent of the input data.

43. Switch driver circuit according to claim 36, wherein the circuit is arranged such that the net current flowing through the clock nodes is independent of the input data.

44. Switch driver circuitry as claimed in claim 36, wherein each said signal supply path comprises a single switch which directly connects said clock node to the ouptut node of that path.

45. Switch driver circuitry, for driving a differential switch circuit, the circuitry having a plurality of switch driver circuits, each said switch driver circuit comprising:
a data node at which an input data signal is received;
a clock node at which a clock signal is received;
a first signal supply path from the clock node to a first output node at which a first drive signal is output to the differential switch circuit, said first path including a first switch;
a second signal supply path from the clock node to a second output node at which a second drive is output to the differential switch circuit, said second path including a second switch;
each said switch being switchable in dependence upon a value of the data signal between an on state and an off state;
each said switch driver circuit being operable, prior to a change in its clock signal from an inactive state to an active state, to set the switch in one of the its signal supply paths to the on state and to set the switch in other of its two signal supply paths to the off state in dependence upon a next value of the data signal, so that when said change subsequently occurs the clock signal or a signal derived therefrom is supplied, via the signal supply path having the on switch, to the output node of that path without having to turn on that switch.

46. Switch driver circuitry as claimed in claim 45, operable in alternate first and second cycles, and having first and second such switch driver circuits, wherein a first clock signal is applied to said clock node of said first driver circuit and a second clock signal is applied to said clock node of said second switch driver circuit, said first clock signal having said active state and said second clock signal having said inactive state in the first cycles and said first clock signal having said inactive state and said second clock signal having said active state in the second cycles, and wherein changes, if any, in the data signal applied to said data node of said second switch driver circuit are made during the first cycles, and changes, if any, in the data signal applied to said data node of said first switch driver circuit are made during the second cycles.

47. Switching circuitry operable in a series of clock cycles to connect a common node of the circuitry to one of first and second nodes of the circuitry in dependence on an input digital signal, the switching circuitry comprising a plurality of switches for connecting the common node to the first and second nodes, the circuitry begins arranged such that, in operation, the same number of switches change state in each clock cycle.

48. Switching circuitry according to claim 47 comprising first and third switches connected between the common node and the first node and second and fourth switches connected between the common node and the second node, wherein the circuitry is arranged such that, in at least one cycle of the series, one of the first and second switches is conductive in dependence on the input digital signal and the other switches are non-conductive, and, in at least one other cycle of the series, one of third and fourth switches is conductive in dependence on the input digital signal and and other switches are non-conductive.

49. Switching circuitry according to claim 48, operable in alternate first and second cycles, wherein in the first cycles one the first and second switches is conductive and the other switches are non-conductive, and in the second cycles on of the third and fourth switches is conductive and the other switches are non-conductive.

50. Circuitry according to claim 47, the switching circuitry comprising n pairs of switches, where n ≧2, with one switch of each pair connected between the common node and the first node and the other switch of each pair connected between the common node and the second node, the circuitry being operable in repeating sequences of n cycles, wherein the circuitry is arranged such that, in each cycle of a sequence, a different pair of switches is controlled such that one switch of the pair is conductive and the other switch of the pair is non-conductive in dependence on the input data signal, and the switches in the other pairs are non-conductive.

51. Switching circuitry according to claim 47, wherein the plurality of switches are transistors.

52. Switching circuitry according to claim 47, further comprising a capacitative element connected to the common node, for compensating for the effect of current flow into capacitances associated with at least one of the plurality of switches.

53. Switching circuitry according to claim 52, wherein the capacitative element is a transistor which is supplied with a signal which is at least approximately the complement of a clock signal which is supplied to the switching circuit.

54. Switching circuitry according to claim 47, further comprising switch driver circuitry arranged to receive the input digital signal and a clock signal and to supply drive signals to the plurality of switches.

55. Circuitry according to claim 47, wherein the circuitry is arranged so as to draw a net current from a power supply which is substantially independent of data in the digital signal.

56. Circuitry according to claim 47, wherein the circuitry is arranged such that the input digital signal has a net current which is substantially independent of data in the digital signal.

57. Circuitry according to claim 47, further comprising decoder circuitry which decodes an input digital signal.

58. Circuitry according to claim 57, wherein the decoder circuitry comprises two decoder circuits each of which operates at half of the clock rate.

59. Circuitry according to claim 58, wherein each of the decoder circuits is arranged to decode one of two time-interleaved data streams.

60. Circuitry according to claim 57, wherein the decoder circuitry comprises a plurality of decoder circuits each of which is arranged to output a data signal to one of the switch driver circuits in each of the analog segments.

61. Circuitry according to claim 60, wherein each of the decoder circuits is arranged such that its data signal changes state during a period in which the clock signal which is supplied to the corresponding drive circuits has a state which prevents a switch in the switching circuitry from changing its state.

62. Skew compensation circuit for receiving two complementary input clock signala and for outputting two complementary output clock signals having reduced skew, the skew compensation circuit comprising first and second inverters for outputting the output clock signals, each inverter comprising two switches connected in series between a high potential and a low potential, and each inverter being arranged such that, when the input clock signals change state, a switch which is in a conductive state is changed to a non-conductive state at a time determined by the clock signal having the fastest clock edge, and a switch which is in a non-conductive state is changed to a conductive state at a time determined by the clock signal having the slowest clock edge.

63. Skew compensation circuitry according to claim 62, wherein in each inverter, one switch is a p-channel field effect transistor and the other switch is an n-channel field effect transistor, the two transistors having separate inputs to their respective gates.

64. Skew compensation circuitry according to claim 62, further comprising a first NAND gate and a second NAND gate, the first NAND gate receiving at its input an input clock signal and the output of the second NAND gate, and the second NAND gate receivimg at its input the complementary input clock signal and the output of the first NAND gate, outputs of the first and second NAND gates being supplied to control inputs of the switches in the first and second inverters.

65. Skew compensation circuitry according to claim 64, wherein each inverter has one input connected to a non-inverted output of one of the NAND gates and the input connected to the inverted output of the other NAND gate.

66. Skew compensation circuitry according to claim 62, where the output clock signals are high impedance during the periods between the fastest edges of the input clock signals and the corresponding slowest edges.

67. A method of performing a series of switching operations in segmented mixed signal circuitry comprising a plurality of analog segments, the method comprising supplying shaped clock signals in common for all of the analog segments, and performing the series of switching operations, each switching operation being dependent on an input data signal, and being performed in a manner determined by the shape of the common shaped clock signals.

68. A method of driving a differential switch, comprising:
receiving an input data signal;
receiving a clock signal at a clock node, the clock node having a first signal supply path therefrom to a first output node at which a first drive signal is output to the differential switch circuit, and also having a second signal supply path therefrom to a second output node at which a second drive signal is output to the differential switch circuit; and
prior to a change in the clock signal from an inactive state to an active state, setting a switch in one of the two signal supply paths to an on state and setting a switch in the other of the two signal supply paths to an off state in dependence upon a next value of the data signal, so that when said change subsequently occurs the clock signal derived therefrom is supplied, via the signal supply path having the on switch, to the output node of that path without having to turn on that switch.

69. A method of connecting a common node of a switching circuit to one of first and second nodes of the circuit in a series of cycles, the method comprising connecting the common node to one of the first and second nodes via one of a plurality of switch in each cycle, wherein the same number of switches changes state in each cycle.

70. A digital-to-analog converter comprising a plurality of switching circuits each operable in a series of clock cycles to connect a common node of the switching circuit to one of first and second nodes of the switching circuit in dependence on an input data signal, wherein each switching circuit comprises a plurality of switches for connecting the common node of the switching circuit to the first and second nodes of the switching circuit, and wherein, in operation, the same number of said plurality of switches change state in each clock cycle.

71. A digital-to-analog converter comprising a plurality of analog segments, each segment comprising four switches arranged to switch a current to one of two output nodes in dependence on an input data signal, wherein the input data signal determines whether the current for the segment is re-routed from one of said output nodes to the other of said output nodes, thereby changing the output of said segment, or routed through a different switch to the same output node so as not to change the output of said segment.

72. A digital-to-analog converter according to claim 71, further comprising two decoder circuits each arranged to decode one of two time-interleaved data streams.

73. Switching circuitry for connecting a common node of the circuitry to one of first and second nodes of the circuitry in a series of clock cycles in dependence on an input data signal, the switching circuitry comprising a plurality of switching means for connecting the common node to the first and second nodes, wherein the same number of switching means change state in each clock cycle.

74. Switching circuitry, operable in alternate first and second cycles, comprising:
  a first data processing circuit which, in the first cycles, generates drive signals in dependence upon data applied to the switching circuitry, which drive signals have a lower frequency than the cycle frequency;
  a second data processing circuit which, in the second cycles, generates drive signals in dependence upon the applied data, which drive signals also have a lower frequency than said cycle frequency; and
  a differential switch circuit having:
  a common node;
  first and second nodes; and
  first, second, third and fourth switches, each of said first and third switches being connected between said common node and said first node, and each of said second and fourth switches being connected between said common node and said second node;
  wherein the first data processing circuit is connected to the first and second switches for applying thereto said drive signals in said first cycles, and the second data processing circuit is connected to the third and fourth switches for applying thereto said drive signals in said second cycles, the drive signals generated by the first and second data processing circuits being such that in each cycle the same number of switches change state.

75. Switching circuitry as claimed in claim 74, wherein in each first cycle one of the first and second switches is conductive in dependence upon the applied data and the other switches are non-conductive and in each second cycle one of the third and fourth switches is conductive in dependence upon the applied data and the other switches are non-conductive.

76. Switching circuitry as claimed in claim 74, wherein the applied data comprises first and second time-interleaved data streams, each having a frequency of half the cycle frequency, and the first data processing circuit is connected to receive and process said first time-interleaved data stream and the second data processing circuit is connected to receive and process said second time-interleaved data stream.

77. Switching circuitry as claimed in claim 74, wherein each said data processing circuit generates its said drive signals at half said cycle frequency.

78. Switching circuitry as claimed in claim 74, wherein the first and second data processing circuits operate such that, when the applied data is unchanged from one cycle to the next cycle, a signal which in said one cycle propagated between the common node and one of the first and second nodes through one of the two switches connected to that one node is rerouted in said next cycle through the other one of those two switches connected to that one node.

79. Switching circuitry as claimed in claim 74, wherein the drive signals generated by the first data processing circuit in the first cycles, and by the second data processing circuit in the second cycles, include an activating drive signal that causes the switch to which it is applied to change from being non-conductive to being conductive, said activating drive signal being a clock signal of the switching circuitry or a signal derived therefrom.

80. Switching circuitry as claimed in claim 79, wherein each data processing circuit is operable, in advance of a future cycle, to employ a value of the applied data applicable to the future cycle to select which of the two switches connected to the data processing circuit is to receive the activating drive signal in the future cycle and to form a signal supply path which, when said future cycle occurs, will supply said clock signal or said derived signal to the selected switch.

81. Switching circuitry as claimed in claim 74, wherein each said data processing circuit comprises:
  a clock node at which a clock signal is received;
  a first signal supply path from the clock node to a first output node at which a first drive signal is output to one of the two switches connected to the data processing circuit, said first path including a first path switch;
  a second signal supply path from the clock node to a second output node at which a second drive signal is output to the other of the two switches connected to the data processing circuit, said second path including a second path switch;
  each said path switch being switchable in dependence upon a value of the applied data between an on state and an off state; and
  each said data processing circuit being operable, prior to a change in the clock signal from an inactive to an active state, to set the path switch in one of the two signal supply paths to the on state and to set the switch in the other of the two signal supply paths to the off state in dependence upon a next value of the applied data, so that when said change subsequently occurs the clock signal or a signal derived therefrom is supplied, via the signal supply path having the on path switch, to a selected one of the switches on the differential switch circuit without having to turn on the path switch in that signal supply path.

82. Switching circuitry, operable in a repeating series of n cycles, where n is an integer greater than one, comprising:
  n data processing circuits, each corresponding to a different one of the n cycles, and each of which generates, in its corresponding cycle, drive signals in dependence upon data applied to the switching circuitry, the drive signals having a lower frequency than the cycle frequency; and
  a differential switch circuit having:
  a common node;
  first and second nodes; and
  n pairs of switches, each pair including a first switch connected between said common node and said first node and a second switch connected between said common node and said second node;
  wherein each said data processing circuit is connected to the first and second switches of a different one of n pairs for applying thereto said drive signals in its said corresponding cycle, the drive signals generated by the n data processing circuits being such that in each cycle the same number of switches change state.

83. Switching circuitry as claimed in claim 82, wherein in each said cycle only one said first switch or only one said second switch is conductive in dependence upon the applied data and all the other switches are non-conductive.

84. Switching circuitry as claimed in claim 83, wherein the n data processing circuits operate such that, when in one cycle one of the first switches is conductive and the applied data is unchanged from that cycle to the next cycle, in said next cycle that first switch is made non-conductive and another one of the first switches is made conductive, and, when in one cycle one of the second switches is conductive and the applied data is unchanged from that cycle to the next cycle, in said next cycle that second switch is made non-conductive and another one of the second switches is made conductive.

85. Switching circuitry as claimed in claim 82, wherein in each said cycle only one switch is changed from being conductive to being non-conductive and only one switch is changed from being non-conductive to being conductive.

86. Switching circuitry as claimed in claim 82, wherein the applied data comprises n time-interleaved data streams, each having a frequency of 1/n of said cycle frequency, and each said data processing circuit is connected to receive and process a different one of said time-interleaved data streams.

87. Switching circuitry as claimed in claim 82, wherein each said data processing circuit generates its said drive signals at 1/n of said cycle frequency.

88. A digital-to-analog converter, operable in alternate first and second cycles, comprising:
    a plurality of analog segments;
    a first data processing circuit which, in the first cycles, generates drive signals for each segment in dependence upon data applied to the converter, which drive signals have a lower frequency than the cycle frequency; and
    a second data processing circuit which, in the second cycles, generates drive signals for each segment in dependence upon the applied data, which drive signals also have a lower frequency than said cycle frequency;
    wherein each said analog segment comprises a differential switch circuit having:
    a common node;
    first and second nodes; and
    first, second, third and fourth switches, each of said first and third switches being connected between said common node and said first node, and each of said second and fourth switches being connected between said common node and said second node; and
    the first data processing circuit is connected to the first and second switches in each segment for applying thereto said drive signals in said first cycles, and the second data processing circuit is connected to the third and fourth switches in each segment for applying thereto said drive signals in said second cycles, the drive signals generated by the first and second data processing circuits being such that in each cycle the same number of switches change state.

89. A digital-to-analog converter as claimed in claim 88, wherein each said data processing circuit comprises a decoder which decodes the applied data, the drive signals for each segment being derived from the decoded data.

90. A digital-to-analog converter, operable in a repeating series of n cycles, where n is an integer greater than one, comprising:
    a plurality of analog segments; and
    n data processing circuits, where n is an integer greater than one, each corresponding to a different one of the n cycles, and each of which generates, in its corresponding cycle, drive signals for each segment in dependence upon data applied to the converter, the drive signals having a lower frequency than the cycle frequency;
    wherein each said analog segment comprises a differential switch circuit having:
    a common node;
    first and second nodes; and
    n pairs of switches, each pair including a first switch connected between said common node and said first node and a second switch connected between said common node and said second node; and
    each said data processing circuit is connected to the first and second switches of a different one of the n pairs in each segment for applying thereto said drive signals in its said corresponding cycle, the drive signals generated by the n data processing circuits being such that in each cycle the same number of switches change state.

91. A digital-to-analog converter as claimed in claim 90, wherein each said data processing circuit comprises a decoder which decodes the applied data, the drive signals for each segment being derived from the decoded data.

92. A method of selectively connecting a common node to one of first and second nodes in dependence upon data, the method comprising:
    in first cycles of alternate first and second cycles, generating drive signals, having a lower frequency than the cycle frequency, in dependence upon the data using a first data processing circuit,
    in the second cycles, generating drive signals, also having a lower frequency than the cycle frequency, in dependence upon the data using a second data processing circuit;
    in the first cycles, applying the drive signals generated by the first data processing circuit to first and second switches, the first switch being connected between the common node and the first node and the second switch being connected between the common node and the second node; and
    in the second cycles, applying the drive signals generated by the second data processing circuit to third and fourth switches, the third switch being connected between the common node and the first node and the fourth switch being connected between the common node and the second node;
    wherein the drive signals generated by the first and second data processing circuits are such that in each cycle the same number of switches change state.

93. A method of selectively connecting a common node to one of first and second nodes in dependence upon data, the method comprising:
    generating drive signals over a repeating series of n cycles, where n is an integer greater than one, using n data processing circuits, each data processing circuit corresponding to a different one of the n cycles and generating the drive signals in its corresponding cycle in dependence upon the data, the drive signals generated by each data processing circuit having a lower frequency than the cycle frequency; and
    in each of the n cycles, applying the drive signals generated by the corresponding data processing circuit to a corresponding pair at switches including a first switch connected between the common node and the first node and a second switch connected between the common node and the second node;
    wherein the drive signals generated by the n data processing circuits are such that in each cycle the same number of switches change state.

* * * * *

UNITED STATES PATENT AND TRADEMARK OFFICE
CERTIFICATE OF CORRECTION

PATENT NO. : 7,034,733 B2
APPLICATION NO. : 10/158918
DATED : April 25, 2006
INVENTOR(S) : Ian Juso Dedic et al.

It is certified that error appears in the above-identified patent and that said Letters Patent is hereby corrected as shown below:

Column 20
    Line 57, change "date" to --data--

Column 21:
    Line 22, change "date" to --data--

Column 23, line 16, change "value" to --value--
    Line 19, change "state," to --to an active state,--
    Line 54, change "conducive" to --conductive--
    Line 62, change "Switch" to --The switch--

Column 24:
    Line 1, change "ouptut" to --output--
    Line 13, after "drive", insert --signal--
    Line 32, after "first", insert --switch--
    Line 49, change "begins" to --being--
    Line 59, after "one of" insert, --the--
    Line 61, delete "and" second occurrence and insert --the--
    Line 65, after "one", insert --of--
    Line 66, change "on" to --one--

Column 25:
    Line 53, change "circuits" to --circuit--
    Line 57, change "signala" to --signals--

Column 26:
    Line 10, change "receivimg" to --receiving--
    Line 17, after "and the", insert --other--
    Line 20, change "where" to --wherein--
    Line 20, change "impedence" to --impedance--
    Line 46, after "signal", insert --or a signal--
    Line 53, change "switch" to --switches--
    Line 54, change "changes" to --change--

UNITED STATES PATENT AND TRADEMARK OFFICE
CERTIFICATE OF CORRECTION

PATENT NO. : 7,034,733 B2
APPLICATION NO. : 10/158918
DATED : April 25, 2006
INVENTOR(S) : Ian Juso Dedic et al.

It is certified that error appears in the above-identified patent and that said Letters Patent is hereby corrected as shown below:

Column 30:
Line 58, after "pair", change "at" to --of--

Signed and Sealed this

Fifteenth Day of August, 2006

JON W. DUDAS
*Director of the United States Patent and Trademark Office*